United States Patent
Lee et al.

(10) Patent No.: US 12,080,799 B2
(45) Date of Patent: Sep. 3, 2024

(54) SEMICONDUCTOR DEVICES WITH ENHANCED SUBSTRATE ISOLATION

(71) Applicant: Samsung Electronics Co., Ltd., Suwon-si (KR)

(72) Inventors: Sohyeon Lee, Suwon-si (KR); Sungsu Moon, Hwaseong-si (KR); Jaeduk Lee, Seongnam-si (KR); Ikhyung Joo, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 48 days.

(21) Appl. No.: 17/715,887

(22) Filed: Apr. 7, 2022

(65) Prior Publication Data
US 2022/0376116 A1 Nov. 24, 2022

(30) Foreign Application Priority Data
May 21, 2021 (KR) .................. 10-2021-0065540

(51) Int. Cl.
*H01L 29/78* (2006.01)
*H01L 29/06* (2006.01)
*H01L 29/786* (2006.01)

(52) U.S. Cl.
CPC .... *H01L 29/78603* (2013.01); *H01L 29/0607* (2013.01)

(58) Field of Classification Search
CPC ........... H01L 29/78603; H01L 29/0607; H01L 21/76281; H01L 27/1203; H01L 29/42384; H01L 29/66772; H01L 29/78654; H01L 29/78696; H01L 27/1218; H01L 27/1262; H01L 21/823481; H01L 21/76224; H01L 21/823437; H01L 21/823462; H01L 29/0649; H01L 29/423; H01L 27/0924; H01L 21/31051; H01L 27/0207; H01L 21/32115; H01L 21/823828; H01L 29/66681; H01L 21/823821; H01L 29/0657; H01L 29/4966; H01L 29/0882; H01L 29/66545; H01L 29/4983; H01L 29/785; H01L 29/1037; H01L 29/0653; H01L 29/66659; H01L 29/7835;
(Continued)

(56) References Cited

U.S. PATENT DOCUMENTS 7,157,350 B2 1/2007 Yang et al.
7,180,159 B2 2/2007 Howard
(Continued)

FOREIGN PATENT DOCUMENTS

KR 100756809 B1 9/2007

*Primary Examiner* — Moin M Rahman
(74) *Attorney, Agent, or Firm* — Myers Bigel, P.A.

(57) ABSTRACT

A semiconductor device includes a substrate having a recess therein that is partially filled with at least two semiconductor active regions. The recess has sidewalls and a bottom that are sufficiently lined with corresponding substrate insulating layers that the at least two semiconductor active regions are electrically isolated from the substrate, which surrounds the sidewalls and bottom of the recess. A sidewall insulating layer is provided, which extends as a partition between first and second ones of the at least two semiconductor active regions, such that the first and second ones of the at least two semiconductor active regions are electrically isolated from each other. First and second gate electrodes are provided in the first and second active regions, respectively.

18 Claims, 34 Drawing Sheets

(58) Field of Classification Search
CPC ........... H01L 29/66689; H01L 29/7816; H01L 21/28088; H01L 29/04–045; H01L 29/16–1608; H01L 29/18–185; H01L 29/22–2206; H01L 21/823878; H01L 29/7854; H01L 29/1054; H01L 21/823807; H01L 27/0922; H01L 27/1211; H01L 21/84; H01L 21/845; H01L 29/66803; H01L 29/66818; H01L 29/7853; H01L 29/51; H01L 29/10; H01L 29/78; H01L 21/28; H01L 21/823857; H01L 29/66795; H01L 21/28194; H01L 29/513; H01L 29/517

See application file for complete search history.

(56) References Cited

U.S. PATENT DOCUMENTS

| | | |
|---|---|---|
| 7,352,030 B2 | 4/2008 | Furukawa et al. |
| 7,358,144 B2 | 4/2008 | Im |
| 7,445,973 B2 | 11/2008 | Gonzalez et al. |
| 7,977,196 B2 | 7/2011 | Cho |
| 8,012,833 B2 | 9/2011 | Im |
| 8,263,444 B2 | 9/2012 | Lee et al. |
| 8,361,869 B2 | 1/2013 | Zhou et al. |
| 2007/0228455 A1 | 10/2007 | Sasago et al. |
| 2007/0252199 A1 | 11/2007 | Chung et al. |
| 2011/0318890 A1* | 12/2011 | Lee ................... H01L 29/66651 438/161 |
| 2013/0175622 A1* | 7/2013 | Haran ............... H01L 29/66772 257/E21.409 |

* cited by examiner

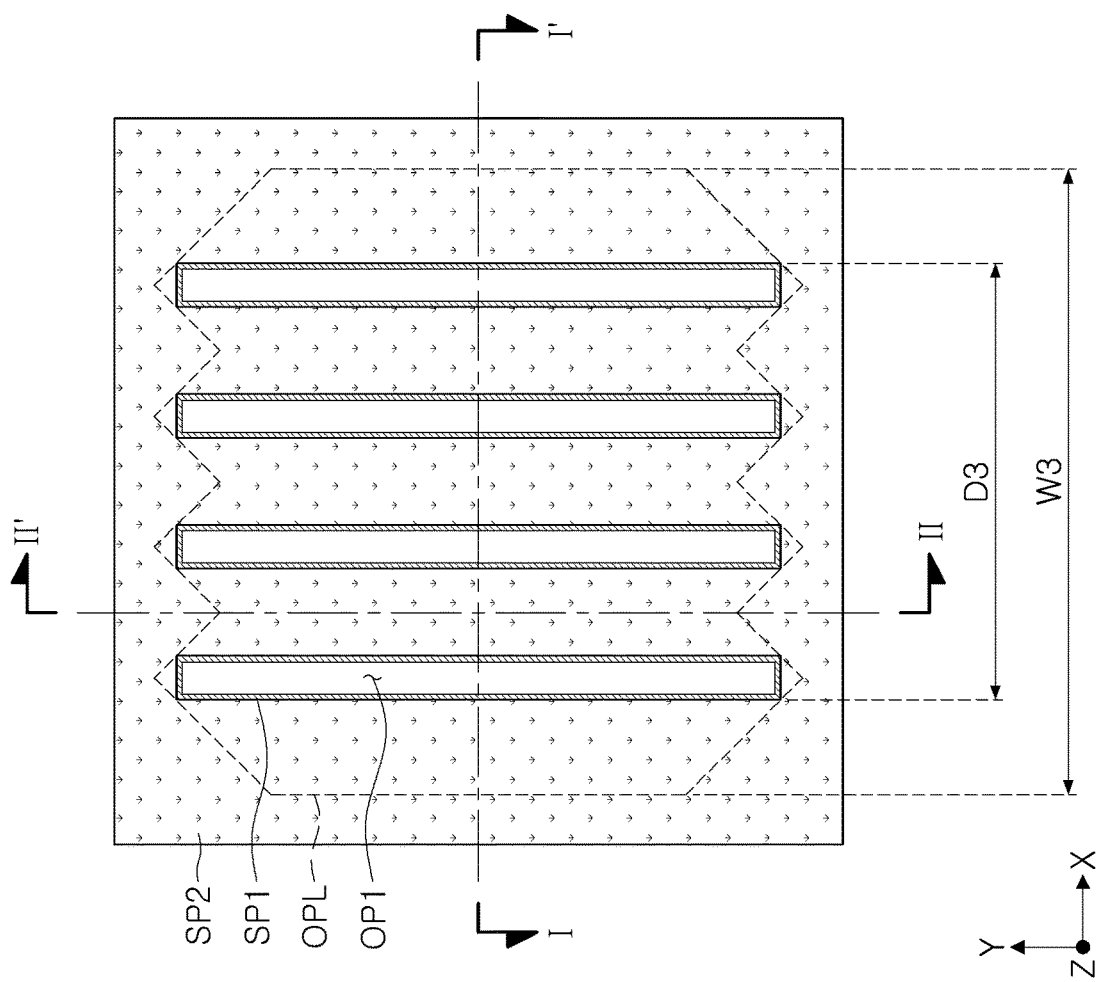

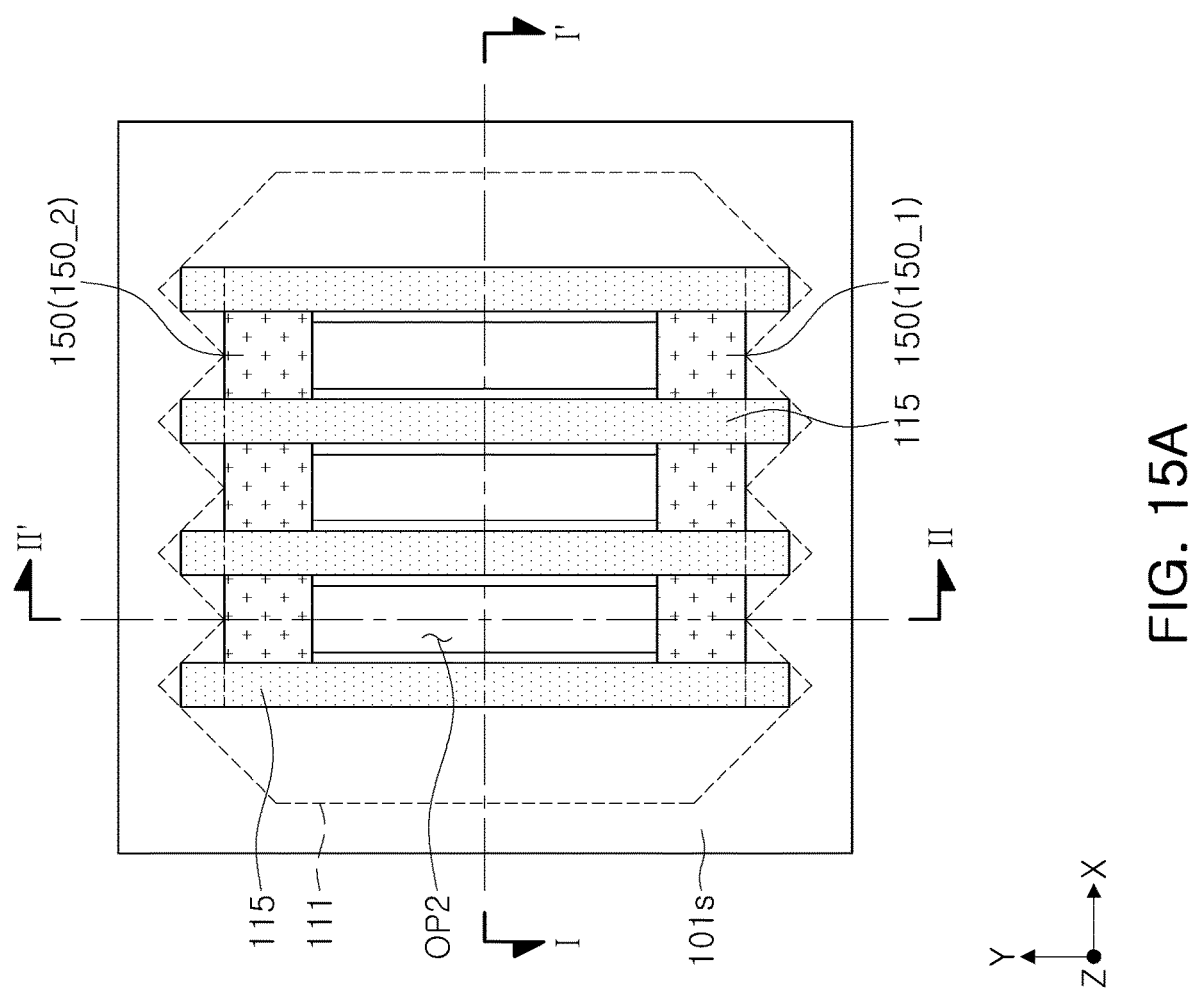

SEMICONDUCTOR DEVICES WITH ENHANCED SUBSTRATE ISOLATION

REFERENCE TO PRIORITY APPLICATION

This application claims priority to Korean Patent Application No. 10-2021-0065540, filed May 21, 2021, the disclosure of which is hereby incorporated herein by reference.

BACKGROUND

Example embodiments of the present disclosure relate to semiconductor devices and methods of forming same.

As the demand for high performance, high speed, and/or multifunctionality of semiconductor devices has increased, the degree of integration of semiconductor devices has concomitantly increased, and a size of transistors within these semiconductor devices has been reduced. Unfortunately, leakage currents associated with these transistors may increase as their size is reduced. To reduce leakage currents, semiconductor devices have been developed using substrates having a silicon-on-insulator (SOI) structure.

SUMMARY

An example embodiment of the present disclosure includes a semiconductor device having a transistor therein with improved performance characteristics.

In an example embodiment of the present disclosure, a semiconductor device is provided in a substrate. The semiconductor device includes a substrate insulating structure. This substrate insulating structure includes: (i) first sidewall insulating layers, which extend in a first direction and are spaced apart from each other in a second direction perpendicular to the first direction, (ii) second sidewall insulating layers, which extend between the first sidewall insulating layers, and are in contact with the first sidewall insulating layers, and are spaced apart from each other in the first direction, and (iii) a lower insulating layer extending below and in contact with each of the first sidewall insulating layers and the second sidewall insulating layers. A gate structure is provided, which includes a side surface and a lower surface surrounded by the substrate insulating structure. The gate structure includes a gate dielectric layer and a gate electrode on the gate dielectric layer. An active region is provided, which extends between the substrate insulating structure and the gate structure. A first source/drain region and a second source/drain region are provided, which are spaced apart from each other on the active region. The substrate covers an external side surface and a lower surface of the substrate insulating structure.

In another example embodiment of the present disclosure, a semiconductor device includes a semiconductor substrate, an active region spaced apart from the semiconductor substrate, and a substrate insulating structure embedded in the semiconductor substrate and lining a lower surface and a side surface of the active region. A gate structure is provided, which extends on the active region. The gate structure includes a gate dielectric layer and a gate electrode on the gate dielectric layer. A first source/drain region and a second source/drain region are provided, which are spaced apart from each other on the active region. The substrate also covers an external side surface and a lower surface of the substrate insulating structure.

In yet another example embodiment of the present disclosure, a semiconductor device is provided, which includes a substrate, and a substrate insulating structure embedded in the substrate. This substrate insulating structure includes a lower insulating layer, first sidewall insulating layers disposed on the lower insulating layer (and spaced apart from each other), and second sidewall insulating layers disposed on the lower insulating layer and in contact with the first sidewall insulating layers. A semiconductor active region is provided, which extends on the lower insulating layer. A first source/drain region and a second source/drain region are provided, which are spaced apart from each other on the active region. A gate structure is provided, which extends on the active region. The gate structure includes a gate dielectric layer and a gate electrode on the gate dielectric layer. At least a portion of the second sidewall insulating layers, the lower insulating layer, and the first sidewall insulating layers are in contact with the substrate.

BRIEF DESCRIPTION OF DRAWINGS

The above and other aspects, features, and advantages of the present disclosure will be more clearly understood from the following detailed description, taken in conjunction with the accompanying drawings, in which.

DETAILED DESCRIPTION

Hereinafter, example embodiments of the present disclosure will be described as follows with reference to the accompanying drawings.

Figure 1:
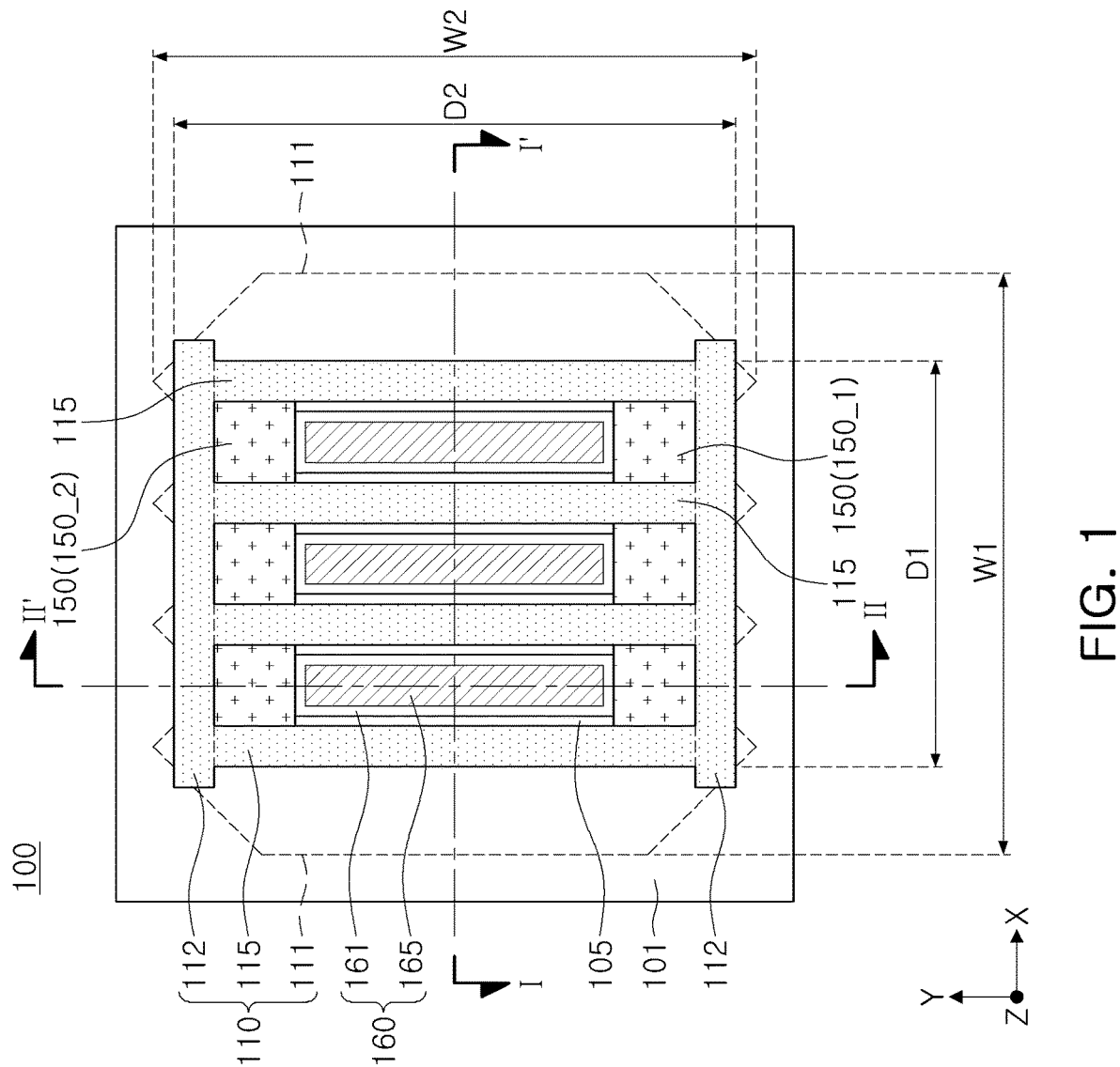
FIG. 1 is a plan layout view of a semiconductor device according to an example embodiment of the present disclosure.
Figure 2:
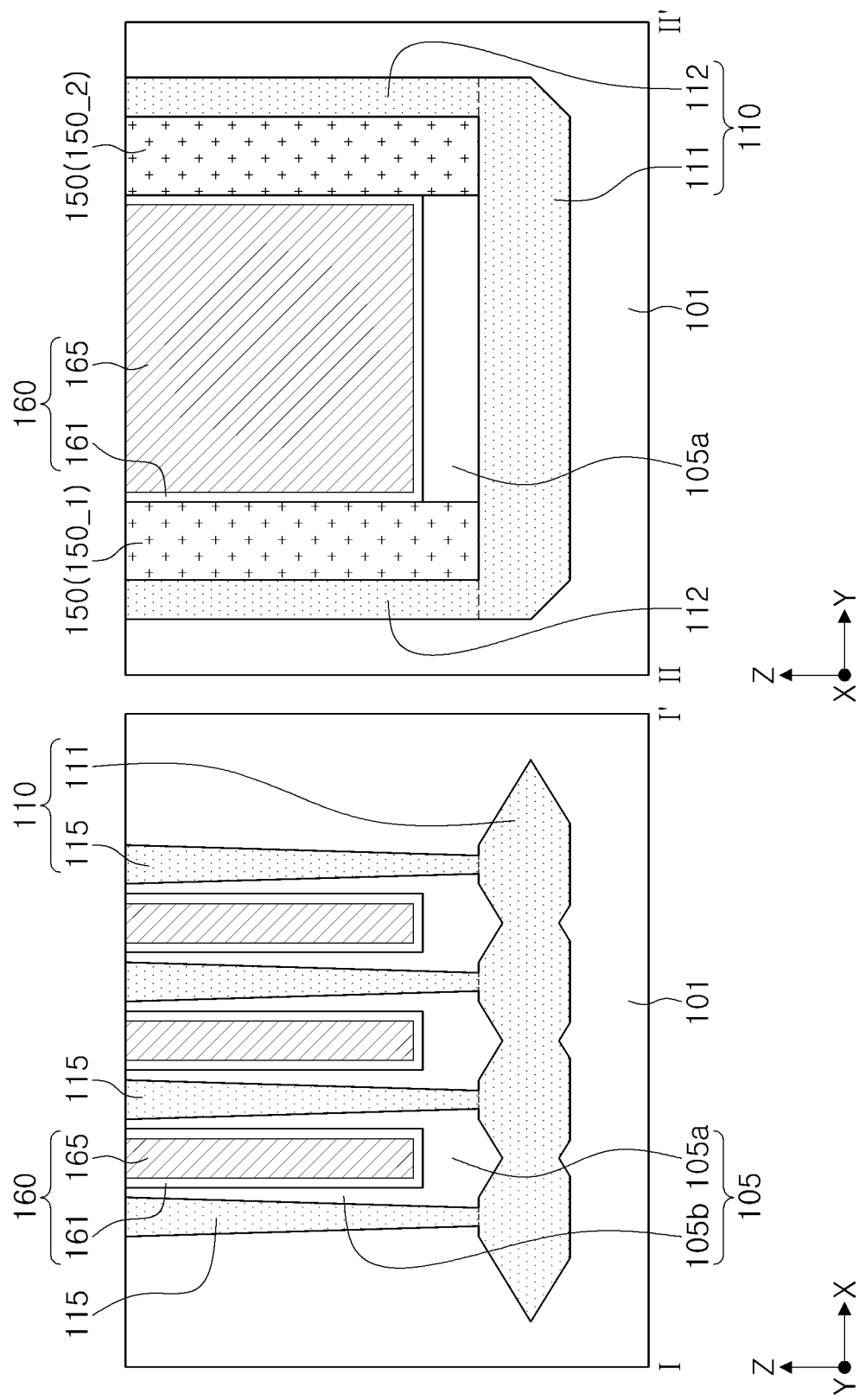
FIG. 2 is a cross-sectional diagram illustrating a semiconductor device according to an example embodiment of the present disclosure.

FIG. 1 is a plan diagram illustrating a semiconductor device according to an example embodiment, and FIG. 2 is a cross-sectional diagram illustrating a semiconductor device according to an example embodiment, taken along lines I-I' and II-II' in FIG. 1. Referring to FIGS. 1 and 2, a semiconductor device 100 may include a substrate 101, a substrate insulating structure 110 embedded in the substrate 101, an active region 105 on the substrate insulating structure 110, a gate structure 160 on the active region 105, and source/drain regions 150 spaced apart from each other on the active region 105.

The substrate 101 may have an upper surface extending in the x direction and the y direction. The substrate 101 may include a recessed region at least in a portion thereof. The substrate insulating structure 110 may be disposed in the recessed region of the substrate 101. The gate structure 160 may be disposed in the recessed region of the substrate 101. The substrate 101 may cover an external side surface and a lower surface of the substrate insulating structure 110, and may also be in contact with an external side surface and a lower surface of the substrate insulating structure 110. The substrate 101 may be spaced apart from the active region 105 by the substrate insulating structure 110.

The substrate 101 may be configured as a semiconductor substrate. The substrate 101 may include a semiconductor material, such as, for example, a group IV semiconductor, a group III-V compound semiconductor, or a group II-VI compound semiconductor. For example, the group IV semiconductor may include silicon (Si), germanium (Ge), or silicon germanium (SiGe).

The substrate insulating structure 110 may be configured as a device isolation structure, and may define the active region 105 in the substrate 101. The substrate insulating structure 110 may be embedded/recessed within the substrate 101. The substrate insulating structure 110 may cover a side surface and a lower surface of the active region 105. The substrate insulating structure 110 may be disposed between the substrate 101 and the active region 105. The substrate insulating structure 110 may surround a side surface and a lower surface of the gate structure 160. In an example embodiment, the substrate insulating structure 110 may include a portion disposed between the substrate 101 and a first portion 105a of the active region 105, a portion disposed between the substrate 101 and a second portion 105b of the active region 105, and a portion disposed between the source/drain region 150 and the substrate 101. The substrate insulating structure 110 may be disposed between the active region 105 and the underlying/surrounding substrate 101 and may reduce leakage current of a transistor. The transistor may be configured as the gate structure 160, the source/drain regions 150, and a channel region in the active region 105 facing the gate structure 160.

The substrate insulating structure 110 may include a lower insulating layer 111, first sidewall insulating layers 112 disposed on the lower insulating layer 111, and second sidewall insulating layers 115 disposed on the lower insulating layer 111. Each of the first sidewall insulating layers 112 may extend from the lower insulating layer 111. Each of the second sidewall insulating layers 115 may extend from the lower insulating layer 111. The second sidewall insulating layers 115 may be in contact with corresponding ones of the first sidewall insulating layers 112. In other words, the lower insulating layer 111, the first sidewall insulating layers 112, and the second sidewall insulating layers 115 may form a single insulating structure within the substrate 101 by being connected to each other.

The lower insulating layer 111 may be disposed on the substrate 101. The lower insulating layer 111 may be disposed on a height level lower than a height level of an upper surface of the substrate 101. The lower insulating layer 111 may be disposed on a height level lower than a height level of the gate structure 160. The lower insulating layer 111 may be disposed on a height level lower than a height level of the active region 105. The lower insulating layer 111 may be disposed below the first sidewall insulating layers 112 and below the second sidewall insulating layers 115. The lower insulating layer 111 may be in contact with the first sidewall insulating layers 112 and the second sidewall insulating layers 115. The lower insulating layer 111 may be spaced apart from the gate structure 160. The lower insulating layer 111 may cover a lower surface of the active region 105, such that the active region 105 extends between the lower insulating layer 111 and the gate structure 160. The first portion 105a of the active region 105 may be disposed between the lower insulating layer 111 and the lower surface of the gate structure 160. In an example embodiment, the lower insulating layer 111 may be in contact with the source/drain region 150.

A side surface of the lower insulating layer 111 may protrude further than a side surface of the second sidewall insulating layers 115 in contact with the substrate 101 among the second sidewall insulating layers 115 in the x direction. At least a portion of the side surface of the lower insulating layer 111 may protrude further than side surfaces of the first sidewall insulating layers 112 in the y direction. In an example embodiment, the external side wall of the lower insulating layer 111 may have an angular shape. In an example embodiment, the angular-shaped external side wall of the lower insulating layer 111 may be formed using a wet etching process during the manufacturing method described hereinbelow with reference to FIGS. 12A and 12B. However, the shape of the lower insulating layer 111 may be varied in other example embodiments.

A width W1 of the lower insulating layer 111 in the x direction may be a maximum width of the substrate insulating structure 110 in the x direction. A width W2 of the lower insulating layer 111 in the y direction may be a maximum width of the substrate insulating structure 110 in the y direction. The width W1 of the lower insulating layer 111 may be greater than a distance between the second insulating layers 115 in the x direction. The width W1 of the lower insulating layer 111 may be greater than a distance D1 between a pair of second insulating layers 115 the farthest apart among the second insulating layers 115 in the x direction. A width of at least a portion of the lower insulating layer 111 may be greater than a distance D2 between the first insulating layers 112.

Each of the first sidewall insulating layers 112 may extend in the x direction on the substrate 101. Each of the first sidewall insulating layers 112 may be disposed to be in contact with the second sidewall insulating layers 115. Each of the first sidewall insulating layers 112 may be disposed on the lower insulating layer 111 and may be in contact with the lower insulating layer 111.

Each of the second sidewall insulating layers 115 may extend in the y direction on the substrate 101. Each of the second sidewall insulating layers 115 may be disposed between the first sidewall insulating layers 112. Each of the second sidewall insulating layers 115 may be disposed on the lower insulating layer 111 and may be in contact with the lower insulating layer 111. The number of the second sidewall insulating layers 115 is illustrated as four (4), but is not limited thereto, and the number of the second sidewall insulating layers 115 may be varied in other example embodiments. For example, the number of the second sidewall insulating layers 115 may be two or more. In an example embodiment, at least a portion of the second sidewall insulating layers 115 may be disposed between the substrate 101 and the active region 105. In an example embodiment, when three or more second insulating sidewall layers 115 are provided, a portion of the second sidewall insulating layers 115 may be disposed between the active regions 105 spaced apart from each other. In an example embodiment, when three or more second sidewall insulating layers 115 are provided, a plurality of the gate structures 160 may be disposed between each of the adjacent second sidewall insulating layers 115.

The substrate insulating structure 110 may include an insulating material, such as an oxide (e.g., SiO2). The active region 105 may be defined by the substrate insulating structure 110 disposed on the substrate 101. Channel regions of transistors may be formed in the active region 105. The active region 105 may have a structure embedded in the substrate 101. The active region 105 may be disposed within a recessed region of the substrate 101. The active region 105 may be spaced apart from the substrate 101 by the insulating structure 110, and may not be in contact with the substrate 101. The active region 105 may include the same semiconductor material as that of the substrate 101, and may also include impurities/dopants. In an example embodiment, a plurality of the active regions 105 may be spaced apart from each other in the x direction.

The active region 105 may include a first portion 105a disposed between a lower surface of the gate structure 160 and the lower insulating layer 111 and a second portion 105b disposed between the gate structure 160 and the second sidewall insulating layers 115. The first portion 105a of the active region 105 may be disposed between the source/drain regions 150 disposed on both sides of the gate structure 160. The first portion 105a of the active region 105 may be disposed between the first source/drain region 150_1 and the second source/drain region 150_2. The first portion 105a of the active region 105 may cover the lower surface of the gate structure 160. The second portion 105b of the active region 105 may cover the side surface of the gate structure 160 and may cover the second sidewall insulating layer 115. Since the active region 105 may include a first portion 105a covering the lower surface of the gate structure 160 and a second portion 105b covering the side surfaces of the gate structure 160 and the second sidewall insulating layer 115, the width of the channel region in the active region 105 may increase. As the width of the channel region is configured to be large, current drivability of the transistor may improve.

The gate structure 160 may be disposed to extend in the y direction between the first sidewall insulating layers 112 and between the second sidewall insulating layers 115. The side and lower surfaces of the gate structure 160 may be surrounded by the substrate insulating structure 110. The gate structure 160 may be embedded in the substrate 101. The gate structure 160 may be spaced apart from the lower insulating layer 111 and the first sidewall insulating layers 112. The gate structure 160 may be disposed between the first sidewall insulating layers 112 and between the second sidewall insulating layers 115. Side and lower surfaces of the gate structure 160 may be surrounded by the first sidewall insulating layers 112 and the lower insulating layer 111. Side and lower surfaces of the gate structure 160 may be surrounded by the second sidewall insulating layers 115 and the lower insulating layer 111. Each of the plurality of gate structures 160 may be disposed between the first sidewall insulating layers 112 and between the second sidewall insulating layers 115 adjacent to each other among the second sidewall insulating layers 115. In an example embodiment, a side surface of the gate structure 160 may be spaced apart from the second sidewall insulating layers 115 by the second portion 105b of the active region 105.

The gate structure 160 may include a gate dielectric layer 161 and a gate electrode 165 on the gate dielectric layer 161.

The gate dielectric layer 161 may be disposed between the active region 105 and the gate electrode 165. In an example embodiment, the gate dielectric layer 161 may be disposed between the first portion 105a of the active region 105 and the gate electrode 165 and between the second portion 105b of the active region 105 and the gate electrode 165. The gate dielectric layer 161 may be disposed to surround overall surfaces other than an uppermost surface of the gate electrode 165. The gate dielectric layer 161 may include an oxide, nitride, or high-k material (i.e., a dielectric material having a dielectric constant greater than silicon oxide (SiO$_2$)).

The gate electrode 165 may be disposed on the gate dielectric layer 161. The gate electrode 165 may include a conductive material, such as, for example, a metal nitride (e.g., titanium nitride (TiN), tantalum nitride (TaN), and/or tungsten nitride (WN)), and/or a metal material such as aluminum (Al), tungsten (W), or molybdenum (Mo), or a semiconductor material such as doped polysilicon. In the example embodiment, a single gate electrode 165 is provided, but an example embodiment thereof is not limited thereto. For example, the gate electrode 165 may include two or more multilayers having different conductive materials.

The source/drain regions 150 may be disposed on the active region 105. The source/drain regions 150 may be disposed on both sides of the gate structure 160 in the y direction, respectively. Each of the source/drain regions 150 may have an upper surface coplanar with an uppermost surface of the substrate 101. In an example embodiment, a depth of each of the source/drain regions 150 may be substantially equal to a distance from the upper surface of the substrate 101 to the lower insulating layer 111. A lower surface of the source/drain regions 150 may be disposed on a height level lower than a height level of a lower surface of the gate structure 160. The source/drain regions 150 may include a first source/drain region 150_1 and a second source/drain region 150_2 spaced apart from each other on the active region 105. The source/drain regions 150 may serve as a source region or a drain region of a transistor. The source/drain regions 150 may be a semiconductor layer including a semiconductor material. For example, the source/drain regions 150 may include silicon (Si). In an example embodiment, the source/drain regions 150 may include a first conductivity-type semiconductor layer including a first dopant. The source/drain regions 150 may include impurities of different types and/or concentrations. For example, the source/drain regions 150 may include n-type doped silicon (Si) and/or p-type doped silicon germanium (SiGe).

Figure 3:
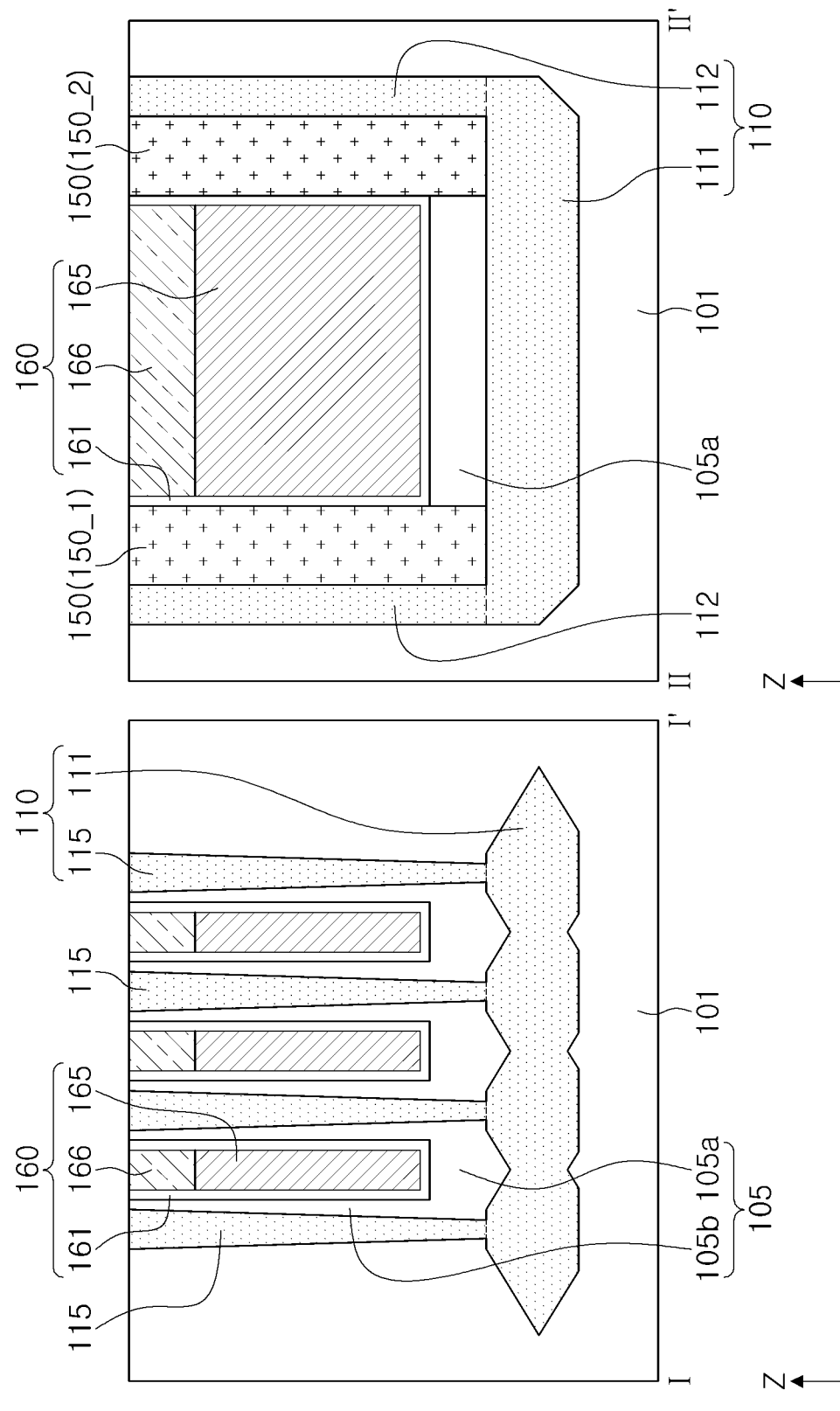
FIG. 3 is a cross-sectional diagram illustrating a semiconductor device according to an example embodiment of the present disclosure.

FIG. 3 is a cross-sectional diagram illustrating a semiconductor device according to an example embodiment, illustrating a modified example of the semiconductor device 100 described with reference to FIGS. 1 and 2 taken along lines I-I' and II-II' in FIG. 1. Referring to FIG. 3, the gate structure 160 of the semiconductor device 100 may further include an electrically insulating gate capping layer 166 disposed on the gate electrode 165.

The gate capping layer 166 may be disposed to extend in the y direction along the upper surface of the gate electrode 165. In an example embodiment, a side surface of the gate capping layer 166 may be in contact with the active region 105. The gate capping layer 166 may be formed of oxide, nitride, and oxynitride, and may include at least one of SiO, SiN, SiCN, SiOC, SiON, and SiOCN, for example. In an example embodiment, a side surface of the gate capping layer 166 may be in contact with the active region 105. In an example embodiment, a side surface of the gate capping layer 166 may be in contact with the first portion 105a of the active region 105.

Figure 4:
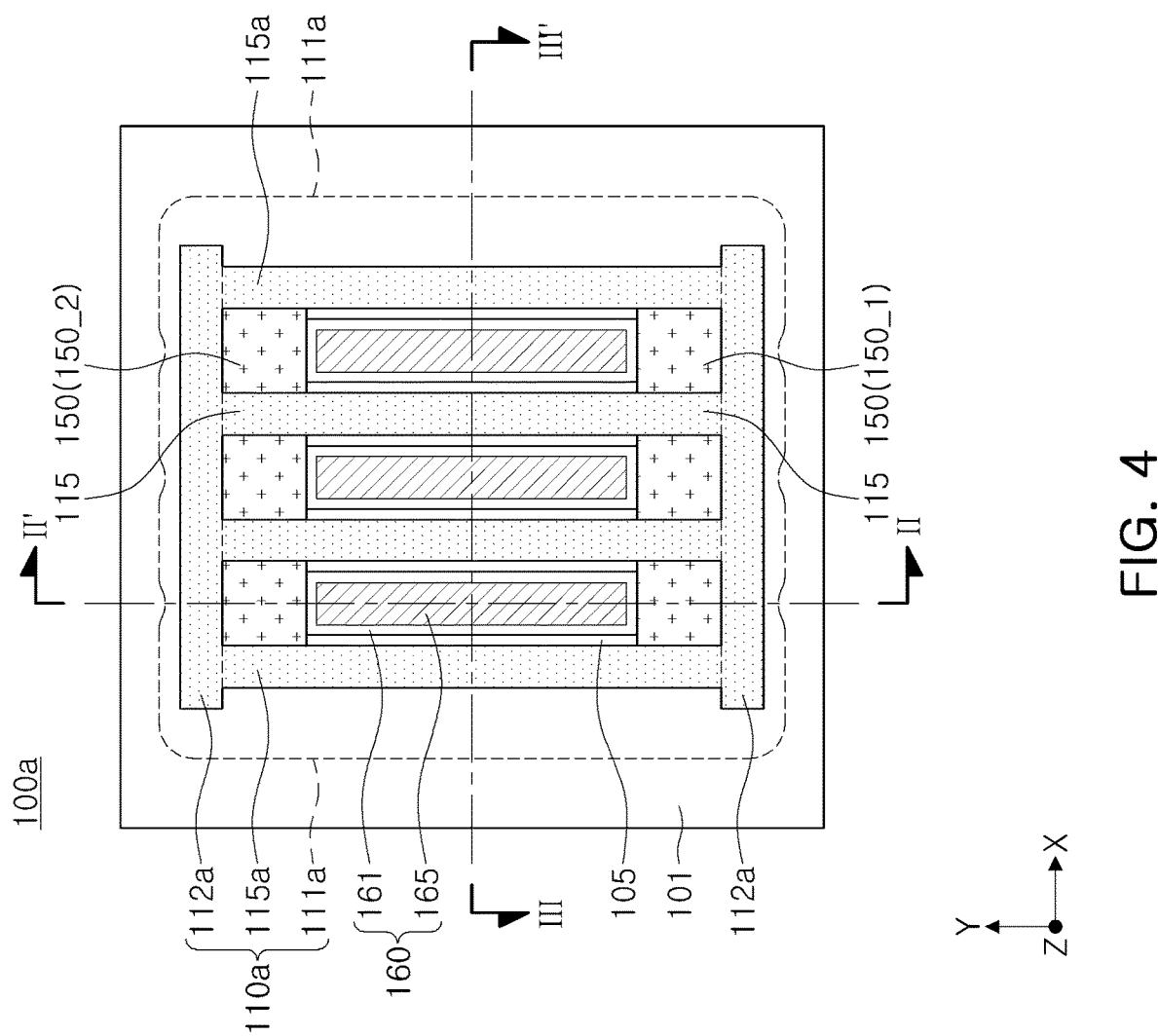
FIG. 4 is a plan layout view of a semiconductor device according to an example embodiment of the present disclosure.
Figure 5:
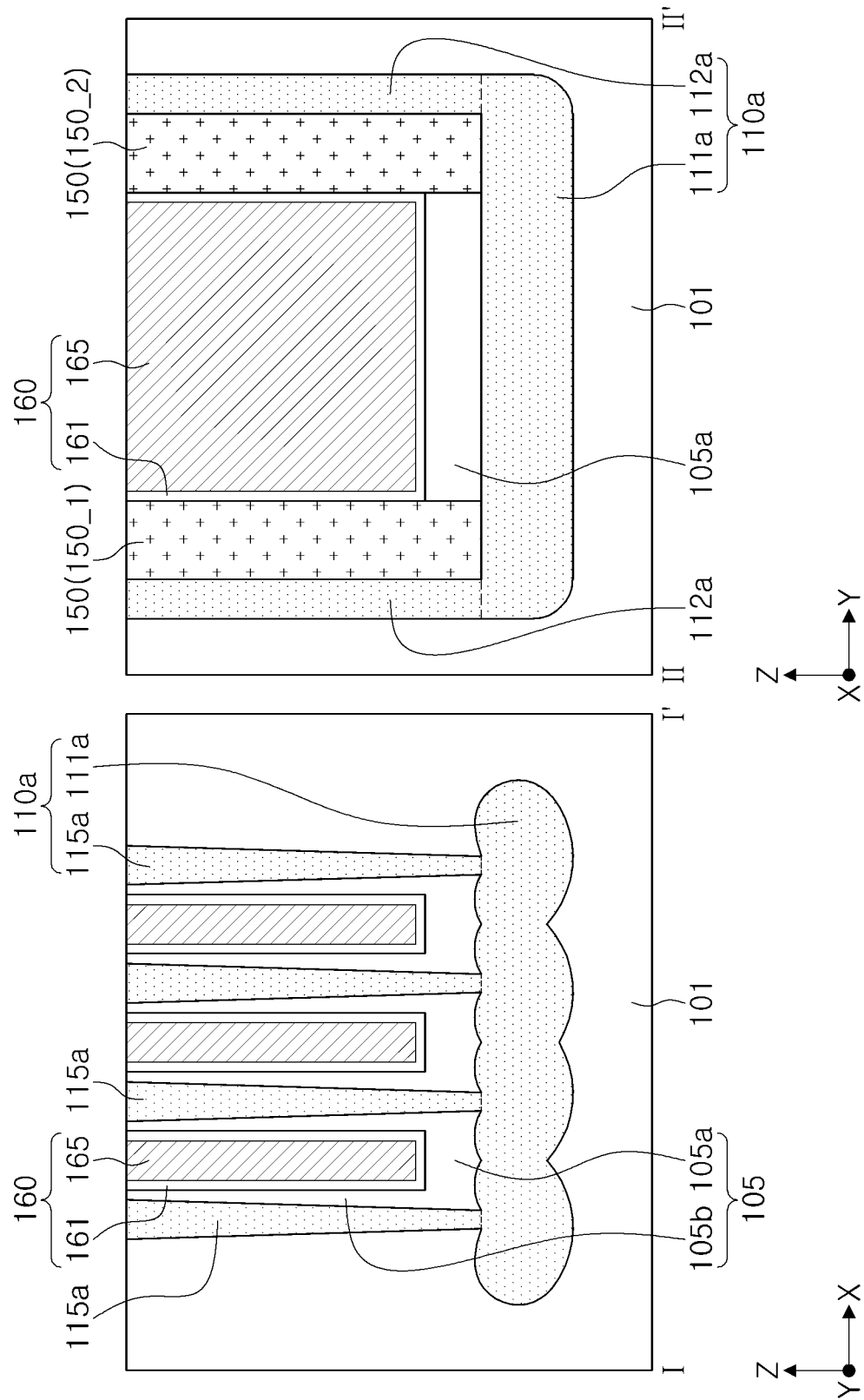
FIG. 5 is a cross-sectional diagram illustrating a semiconductor device according to an example embodiment of the present disclosure.

FIG. 4 is a plan diagram illustrating a semiconductor device according to an example embodiment. FIG. 5 is a cross-sectional diagram illustrating a semiconductor device according to an example embodiment, taken along lines I-I' and II-II' in FIG. 1. Referring to FIGS. 4 and 5, in a semiconductor device 100a, a substrate insulating structure 110a may include a lower insulating layer 111a, first sidewall insulating layers 112a disposed on the lower insulating layer 111a, and second sidewall insulating layers 115a disposed on the lower insulating layer 111a. According to an example embodiment, an external side wall of the lower insulating layer 111a may have a rounded shape, differently from an external side wall of the lower insulating layer 111 in FIGS. 1 and 2. In an example embodiment, the external side wall of the lower insulating layer 111a may have a curved shape. In an example embodiment, the external side wall of the lower insulating layer 111a having a rounded shape may be formed by etching by an isotropic etching process in the manufacturing method described with reference to FIGS. 12A and 12B.

Figure 6:
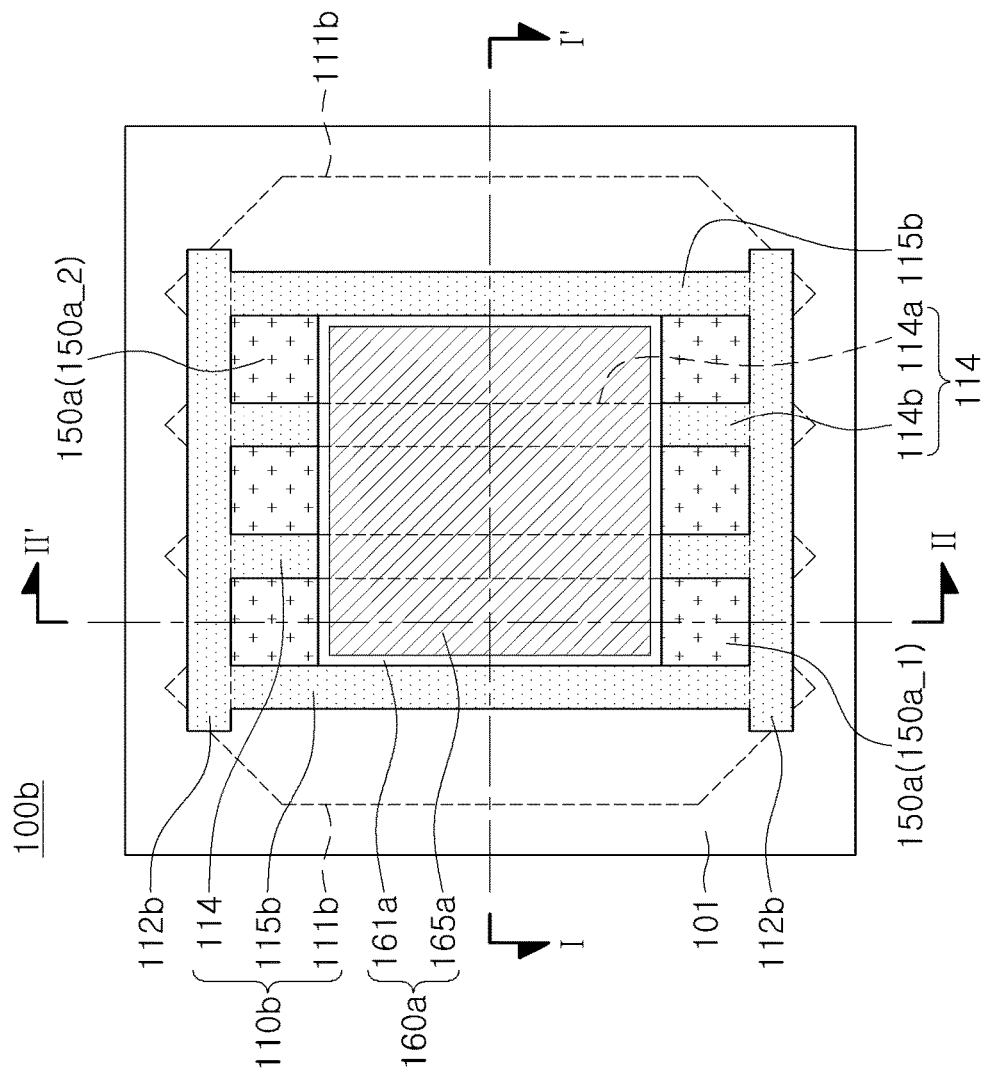
FIG. 6 is a plan layout view of a semiconductor device according to an example embodiment of the present disclosure.
Figure 7:
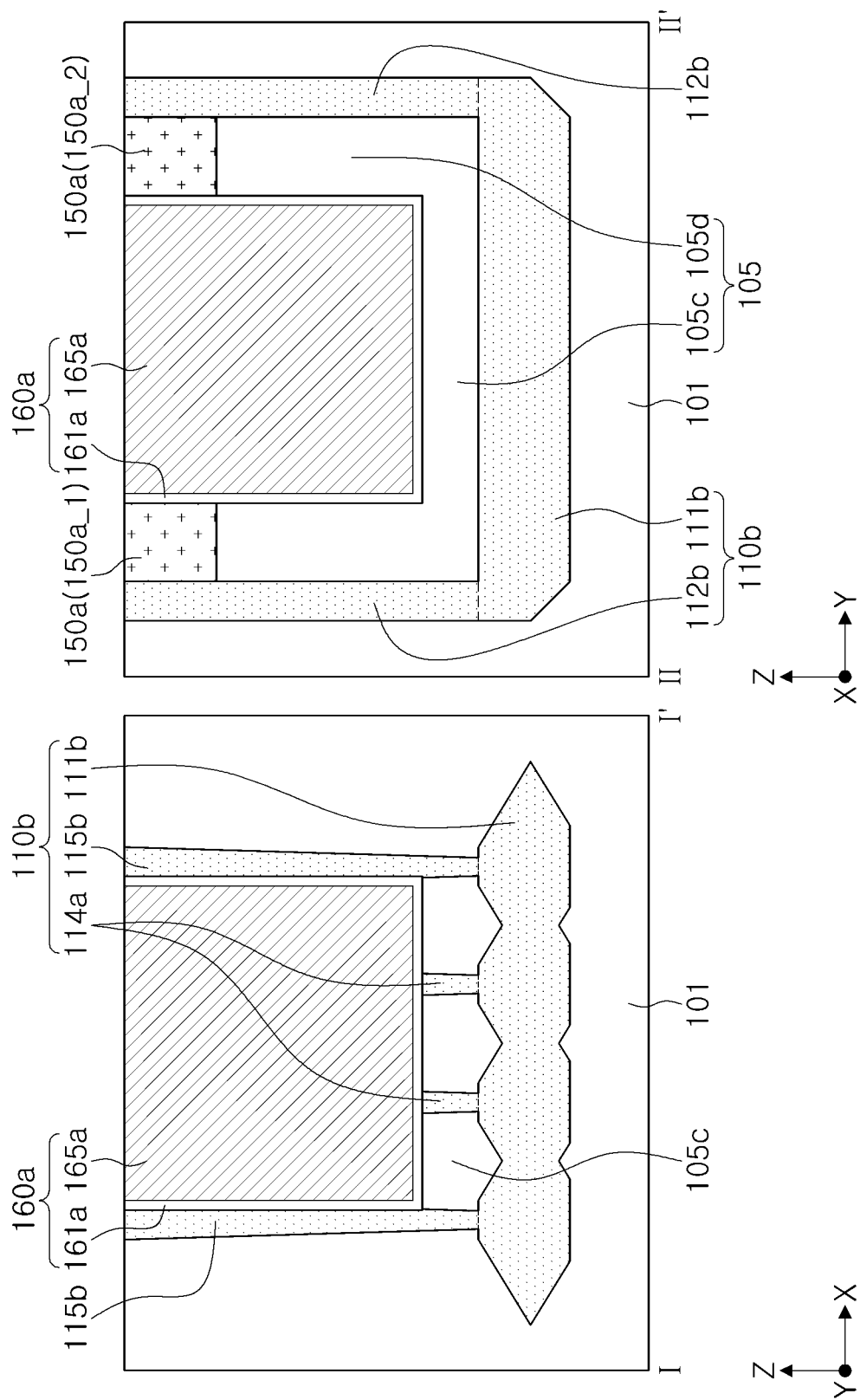
FIG. 7 is a cross-sectional diagram illustrating a semiconductor device according to an example embodiment of the present disclosure.

FIG. 6 is a plan diagram illustrating a semiconductor device according to an example embodiment. FIG. 7 is a cross-sectional diagram illustrating a semiconductor device according to an example embodiment, taken along lines I-I' and II-II' in FIG. 1. Referring to FIGS. 6 and 7, a semiconductor device 100b may include a substrate 101, a substrate insulating structure 110b embedded in the substrate 101, an active region 105 on the substrate insulating structure 110b, a gate structure 160a on the active region 105, and source/drain regions 150a spaced apart from each other on the active region 105.

The substrate insulating structure 110b may define the active region 105 in the substrate 101. The substrate insulating structure 110b may cover the active region 105 on the substrate 101. The substrate insulating structure 110b may cover a side surface and a lower surface of the active region 105. The substrate insulating structure 110b may be disposed between the substrate 101 and the active region 105. In an example embodiment, the substrate insulating structure 110b may be disposed between the substrate 101 and the third portion 105c of the active region 105. In an example embodiment, the substrate insulating structure 110b may be disposed between the substrate 101 and a fourth portion 105d of the active region 105. The substrate insulating structure 110b may be disposed between the source/drain region 150a and the substrate 101.

In an example embodiment, the substrate insulating structure 110b may include a lower insulating layer 111b, first sidewall insulating layers 112b disposed on the lower insulating layer 111b, second sidewall insulating layers 115b disposed on the lower insulating layer 111b, and a third sidewall insulating layer 114 disposed on the lower insulating layer 111b. Each of the first sidewall insulating layers 112b may extend from the lower insulating layer 111. Each of the second sidewall insulating layers 115 may extend from the lower insulating layer 111. The third sidewall insulating layer 114 may extend from the lower insulating layer 111. The second sidewall insulating layers 115 may be in contact with each of the first sidewall insulating layers 112. In other words, the lower insulating layer 111, the first sidewall insulating layers 112, and the second sidewall insulating layers 115 may form a single, highly integrated, insulating structure by being connected to each other.

The lower insulating layer 111b may be disposed below the first sidewall insulating layers 112b, below the second sidewall insulating layers 115b, and below the third sidewall insulating layer 114. The lower insulating layer 111b may be in contact with each of the first sidewall insulating layers 112b, the second sidewall insulating layers 115b, and the third sidewall insulating layer 114. The lower insulating layer 111b may be spaced apart from the gate structure 160. The lower insulating layer 111b may cover the lower surface of the active region 105. The active region 105 may be disposed between the lower insulating layer 111b and the gate structure 160a. The third portion 105c of the active region 105 may be disposed between the lower insulating layer 111b and the gate structure 160. In an example embodiment, the lower insulating layer 111b may be spaced apart from the source/drain region 150.

In an example embodiment, a shape of the lower insulating layer 111b may be the same as that of the lower insulating layer 111 described with reference to FIGS. 1 and 2. In another example embodiment, a shape of the lower insulating layer 111b may be the same as that of the lower insulating layer 111a described with reference to FIGS. 4 and 5. For example, a side surface of the lower insulating layer 111b may protrude further than a side surface of the second sidewall insulating layers 115b in contact with the substrate 101 among the second sidewall insulating layers 115b in the x direction. At least a portion of a side surface of the lower insulating layer 111b in the y direction may protrude further than a side surface of the first sidewall insulating layers 112b. In an example embodiment, the external side wall of the lower insulating layer 111b may have an angular shape or a rounded shape.

Each of the first sidewall insulating layers 112b may extend in the x direction on the substrate 101. Each of the first sidewall insulating layers 112b may extend in the x direction and may be disposed to be in contact with the second sidewall insulating layers 115b and the third sidewall insulating layer 114. Each of the second sidewall insulating layers 115b may extend in the y direction on the substrate 101. In an example embodiment, at least one third sidewall insulating layer 114 may be disposed between the second sidewall insulating layers 115b. Each of the second sidewall insulating layers 115b may be disposed on the lower insulating layer 111b and may be in contact with the lower insulating layer 111b. In an example embodiment, each of the second sidewall insulating layers 115b may be disposed between the substrate 101 and the active region 105 and between the substrate 101 and the gate structure 160. In another example embodiment, each of the second sidewall insulating layers 115b may be in contact with the gate structure 160. In a further example embodiment, the number of the gate structure 160 disposed between a pair of the second sidewall insulating layers 115 may be one.

In an example embodiment, the third sidewall insulating layer 114 may extend in the y direction on the substrate 101. The third sidewall insulating layer 114 may be disposed between the first sidewall insulating layers 112b. The third sidewall insulating layer 114 may be disposed between the second sidewall insulating layers 115b. The third sidewall insulating layer 114 may be disposed on the lower insulating layer 111b and may be in contact with the lower insulating layer 111b. In FIG. 6, two of the third sidewall insulating layers 114 are provided, but the number of third sidewall insulating layers 114 may be varied in example embodiments. For example, the number of the third sidewall insulating layer 114 may be one or two or more.

The third sidewall insulating layer 114 may include a first portion 114a having a height level lower than a height level of the second sidewall insulating layer 115b and a second portion 114b having the substantially same height level as a height level of the second sidewall insulating layer 115b. An upper surface of the first portion 114a of the third sidewall insulating layer 114 may be disposed on a height level lower than a height level of an upper surface of the second sidewall insulating layers 115b. An upper surface of the second portion 114b of the third sidewall insulating layer 114 may be disposed at substantially the same height level as the height level of the upper surface of the second sidewall insulating layers 115b. The gate structure 160 may be disposed on the first portion 114a of the third sidewall insulating layer 114. The first portion 114a of the third sidewall insulating layer 114 may be in contact with the lower surface of the gate structure 160. The first portion 114a of the third sidewall insulating layer 114 may be spaced apart from the source/drain regions 150a. The second portion 114b of the third sidewall insulating layer 114 may be in contact with the source/drain regions 150a. The second portion 114b of the third sidewall insulating layer 114 may cover the side surface of the gate structure 160.

The active region 105 may be defined by a substrate insulating structure 110b disposed on the substrate 101. The active region 105 may include a third portion 105c disposed between the lower surface of the gate structure 160a and the lower insulating layer 111b and fourth portion 105d disposed between the side surface of the gate structure 160a and the first sidewall insulating layers 112b. The third portion 105c of the active region 105 may be disposed between the first sidewall insulating layers 112b and between the second sidewall insulating layer 115b and the third sidewall insulating layer 114. The third portion 105c of the active region 105 may cover the lower surface of the gate structure 160. The fourth portion 105d of the active region 105 may cover the side surface of the gate structure 160 and may cover the first sidewall insulating layer 112b. Since the active region 105 may include the third portion 105c covering the lower surface of the gate structure 160a and the second portion 105b covering the side surface of the gate structure 160a and the first sidewall insulating layer 112b, a length of the channel region in the active region 105 may increase. As the length of the channel region increases, a short channel effect (SCE) may be addressed.

The gate structure 160a may be disposed to extend in the y direction between the first sidewall insulating layers 112a and between the second sidewall insulating layers 115a. The side surface and the lower surface of the gate structure 160a may be surrounded by the substrate insulating structure 110b. The gate structure 160a may be disposed between the first sidewall insulating layers 112b and between the second sidewall insulating layers 115b. The side surface and the lower surface of the gate structure 160a may be surrounded by the first sidewall insulating layers 112b and the lower insulating layer 111b. The side surface and the lower surface of the gate structure 160a may be surrounded by the second sidewall insulating layers 115b and the lower insulating layer 111b. The lower surface of the gate structure 160a may be in contact with the third sidewall insulating layer 114. A lower surface of the gate structure 160a may be in contact with the first portion 114a of the third sidewall insulating layer 114. In an example embodiment, a side surface of the gate structure 160a may be in contact with the second sidewall insulating layers 115b. In an example embodiment, a side surface of the gate structure 160a may be spaced apart from the first sidewall insulating layers 112b by the active region 105. In an example embodiment, a side surface of the gate structure 160a may be spaced apart from the first sidewall insulating layers 112b by the fourth portion 105d of the active region 105.

The components of the gate structure 160a may be the same as those of the gate structure 160 described with reference to FIG. 2 or FIG. 3. For example, the gate structure 160a may include a gate dielectric layer 161a and a gate electrode 165a on the gate dielectric layer 161a, similarly to the gate structure 160 in FIG. 2. In another example embodiment, the gate structure 160a may further include a gate capping layer 166 (see FIG. 3) disposed on the gate electrode 165a, similarly to the gate structure 160 in FIG. 3.

The source/drain regions 150a may be disposed on the active region 105. The source/drain regions 150a may be disposed on both sides of the gate structure 160, respectively. In an example embodiment, the source/drain regions 150a may be disposed on the fourth portion 105d of the active region 105. In an example embodiment, a depth of each of the source/drain regions 150a may be smaller than a distance from the upper surface of the substrate 101 to the lower insulating layer 111. In an example embodiment, a lower surface of the source/drain regions 150a may be disposed on a height level higher than a height level of the lower surface of the gate structure 160. The lower surface of the source/drain regions 150a may be defined as a set of points at which the concentration of impurities in the source/drain regions 150a has a minimum value. The lower surface of the source/drain regions 150a may be disposed on a level lower than the level of the lower surface of the gate structure 160. In an example embodiment, the source/drain regions 150a may be spaced apart from the lower insulating layer 111b by the active region 105. In an example embodiment, the source/drain regions 150a may be spaced apart from the lower insulating layer 111b by the fourth portion 105d of the active region 105. The source/drain regions 150a may include a first source/drain region 150a_1 and a second source/drain region 150a_2 spaced apart from each other on the active region 105.

Figure 8:
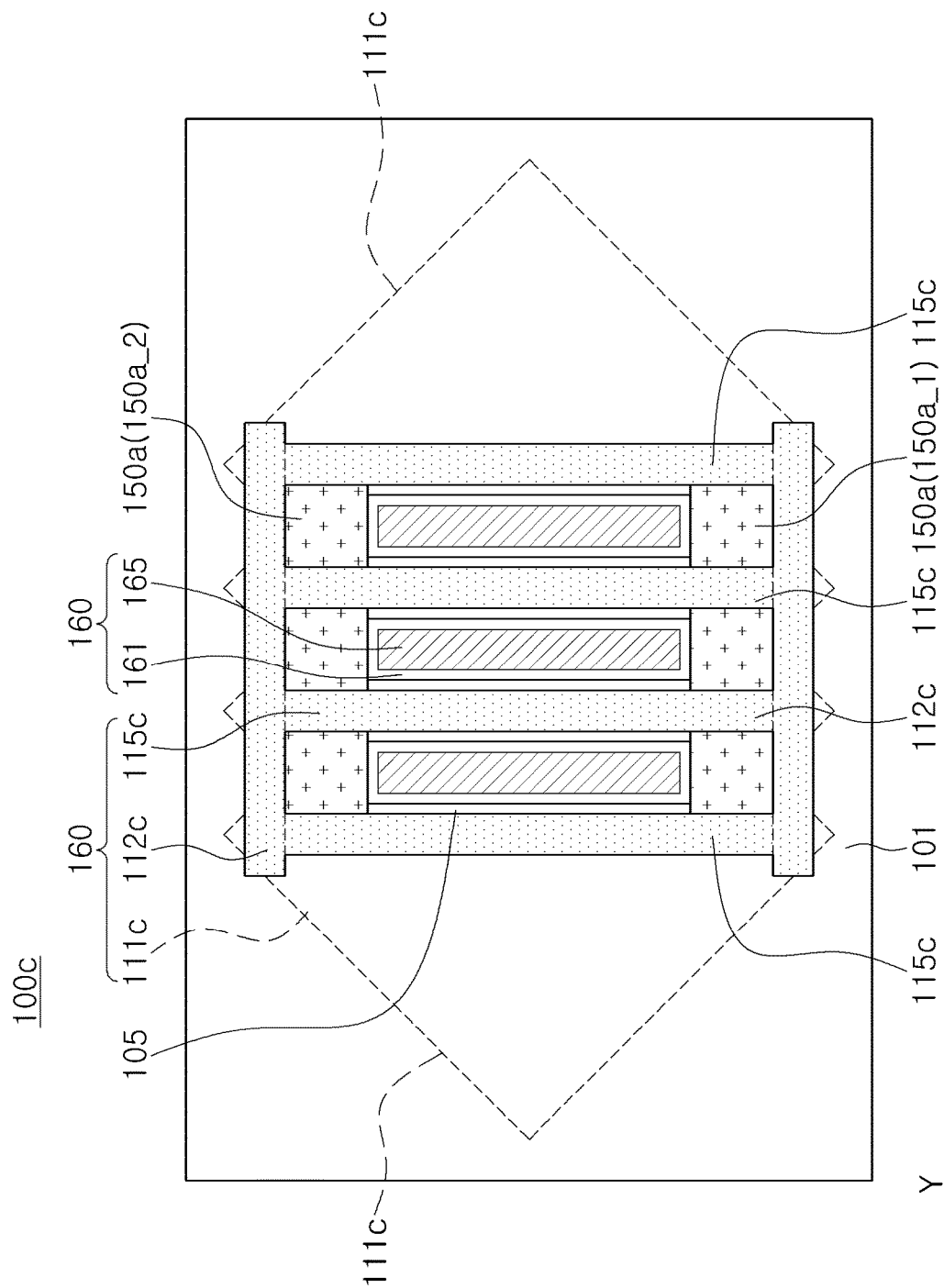
FIG. 8 is a plan layout view of a semiconductor device according to an example embodiment of the present disclosure.

FIG. 8 is a plan diagram illustrating a semiconductor device according to an example embodiment. Referring to FIG. 8, a modified embodiment of the substrate insulating structure 110c in a semiconductor device 100c is illustrated. A width of the lower insulating layer 111c of the substrate insulating structure 110c in the x direction may have the greatest width in a central region of the lower insulating layer 111c taken in the y direction. The width of the lower insulating layer 111c in the x direction may include a portion increasing along the y direction and a portion decreasing along the y direction. The width of the lower insulating layer 111c in the x direction may have the greatest width in the central portion of the insulating structure 110 taken in the y direction.

FIGS. 9A to 17B are diagrams illustrating processes sequence in order to explain of a method of manufacturing a semiconductor device in order according to an example embodiment. In particular, FIGS. 9A-17B illustrate a method of manufacturing the semiconductor device in FIGS. 1 and 2 according to an example embodiment. FIGS. 9A, 10A, 11A, 12A, 13A, 14A, 15A, 16A, and 17A are plan layout diagrams illustrating a method of manufacturing a semiconductor device according to example embodiments. FIGS. 9B, 10B, 11B, 12B, 13B, 14B, 15B, 16B, and 17B are cross-sectional diagrams of intermediate structures that illustrate a method of manufacturing a semiconductor device according to example embodiments. FIGS. 9B, 10B, 11B, 12B, 13B, 14B, 15B, 16B, and 17B illustrate cross-sectional surfaces of the examples in FIGS. 9A, 10A, 11A, 12A, 13A, 14A, 15A, 16A and 17A, respectively, taken along lines I-I' and II-II'.

Figure 9A:
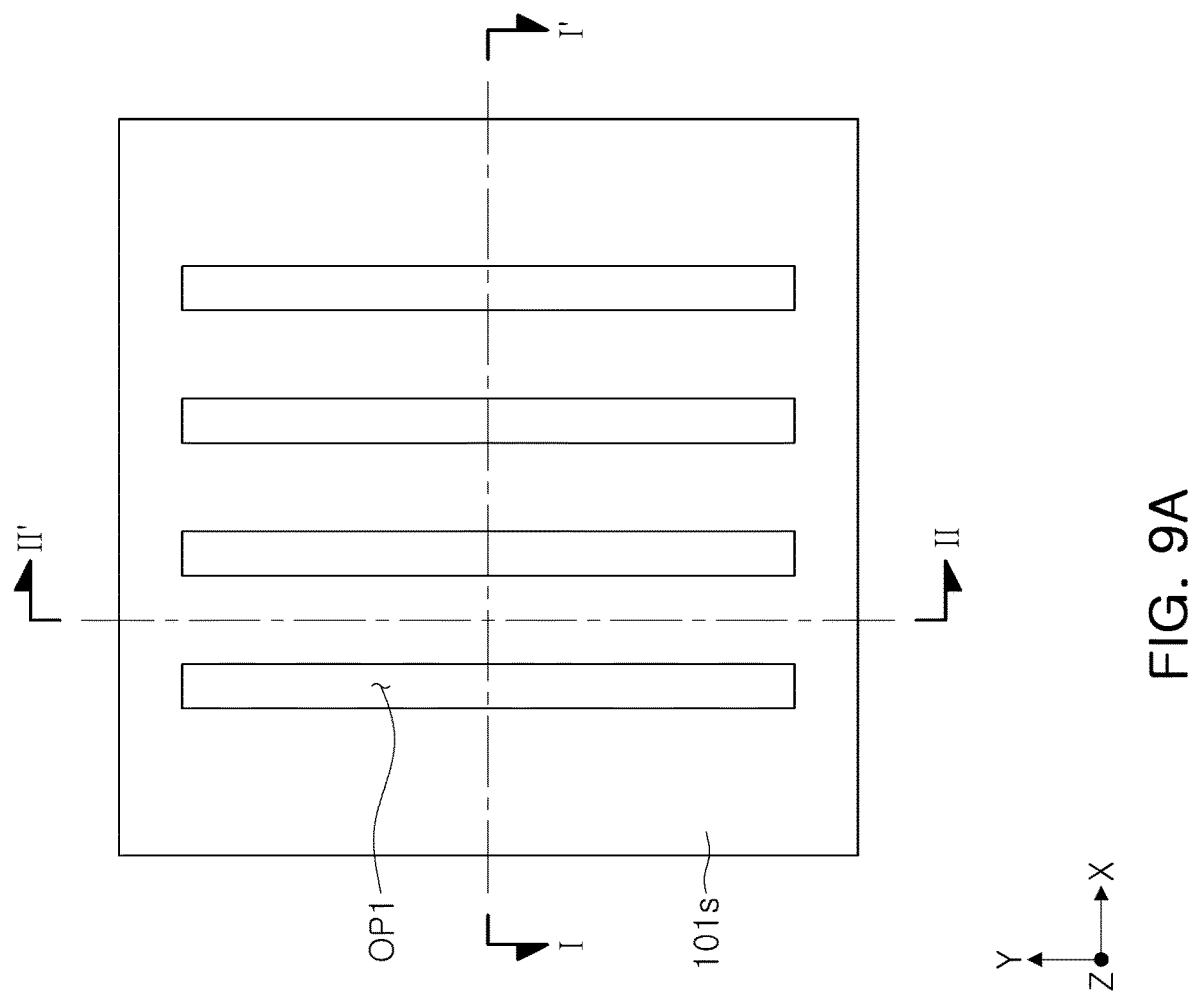
FIGS. 9A to 17B are plan layout views and cross-sectional diagrams of structures that illustrate methods of manufacturing semiconductor devices according to example embodiments of the present disclosure.
Figure 9B:
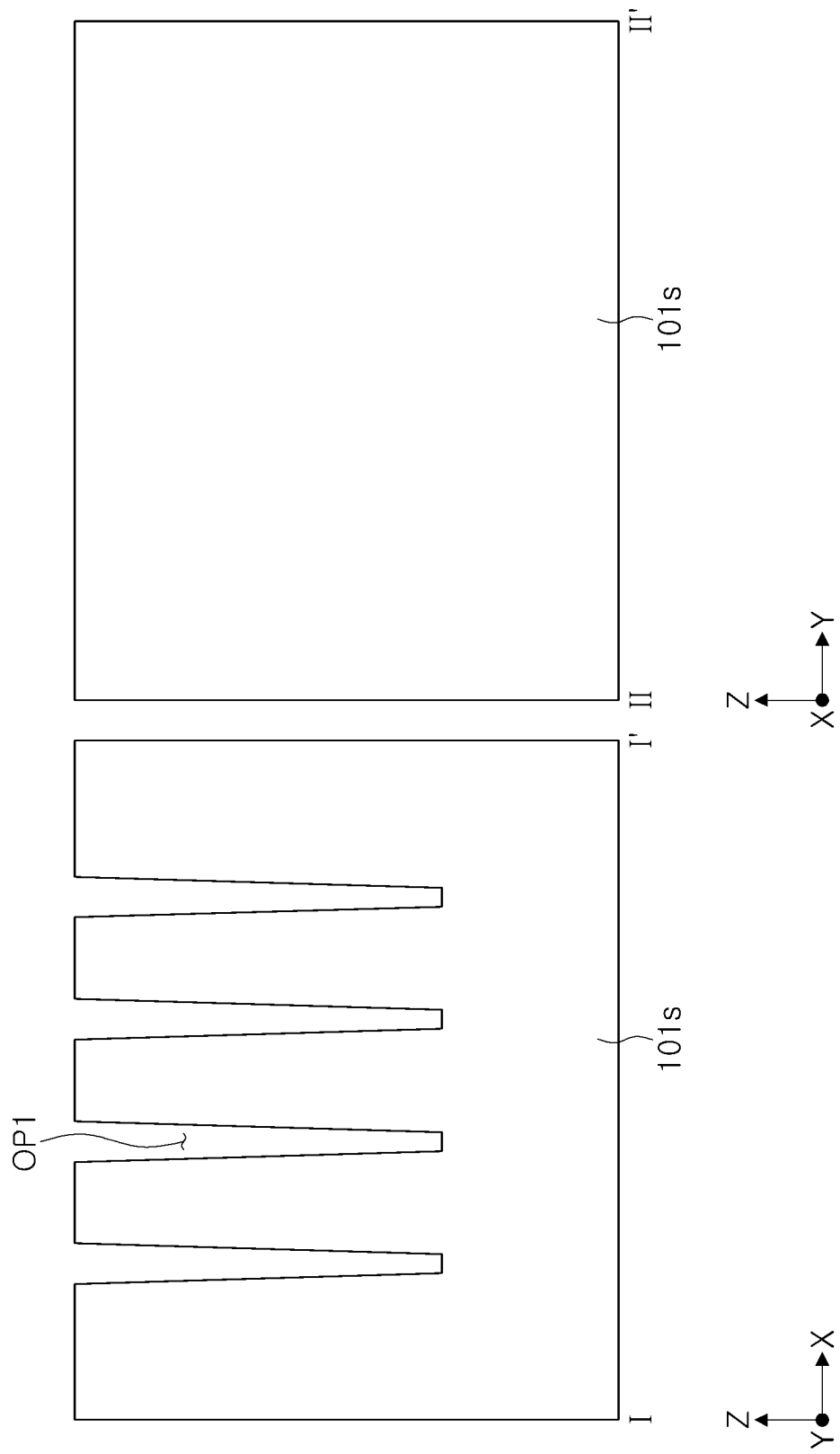

Referring to FIGS. 9A and 9B, a plurality of first openings OP1 may be formed in the semiconductor substrate 101s. The first openings OP1 may be regions in which a portion of the semiconductor substrate 101s is recessed. The first openings OP1 may be formed by removing a portion of the semiconductor substrate 101s. The first openings OP1 may be formed by, for example, removing a portion of the semiconductor substrate 101s by performing a photo process and an etching process. Each of the plurality of first openings OP1 may extend in the y direction and may be spaced apart from each other in the x direction. The first openings OP1 may be formed in positions corresponding to the second sidewall insulating layers 115 described with reference to FIGS. 1 and 2.

Figure 10A:
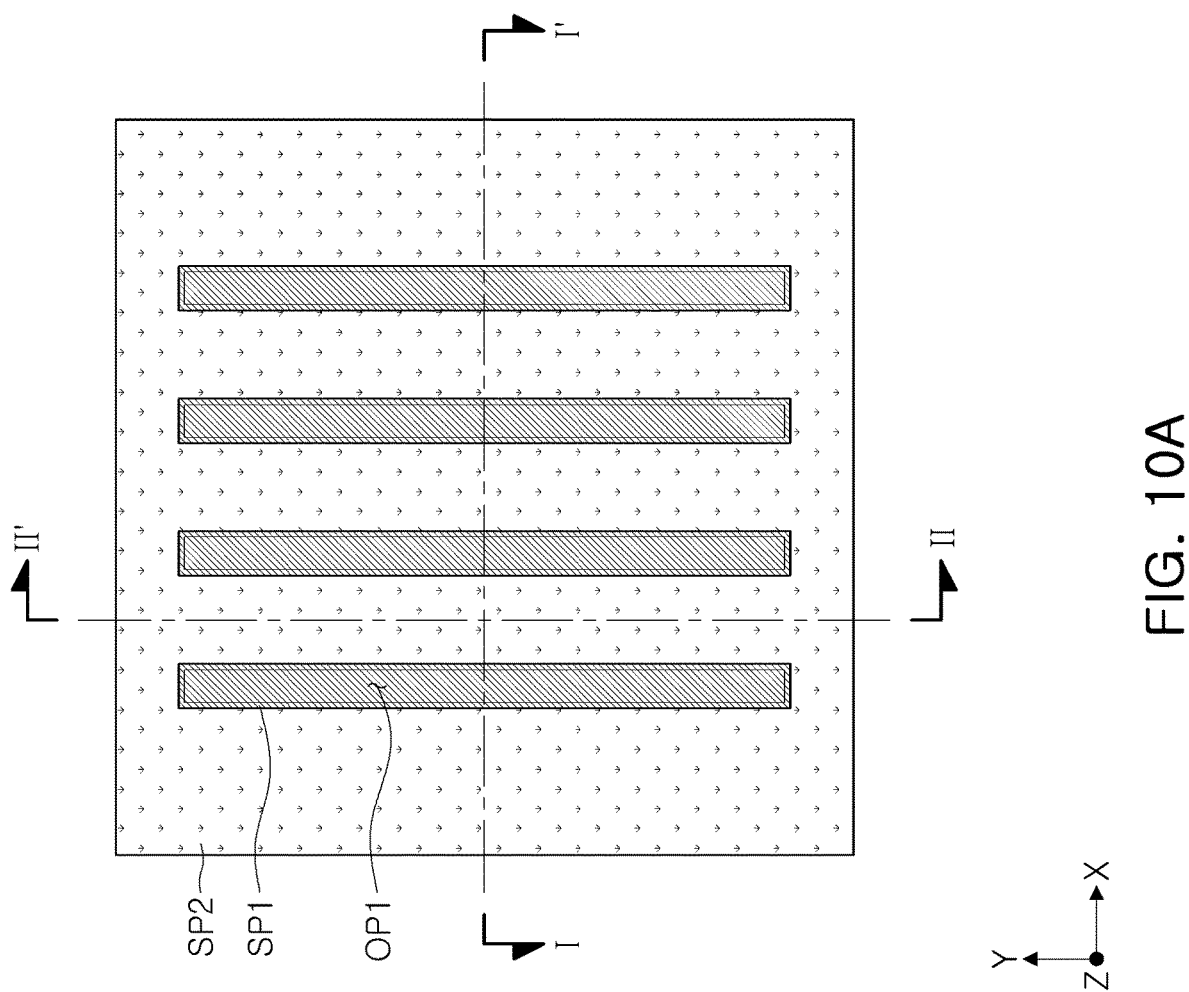
Figure 10B:
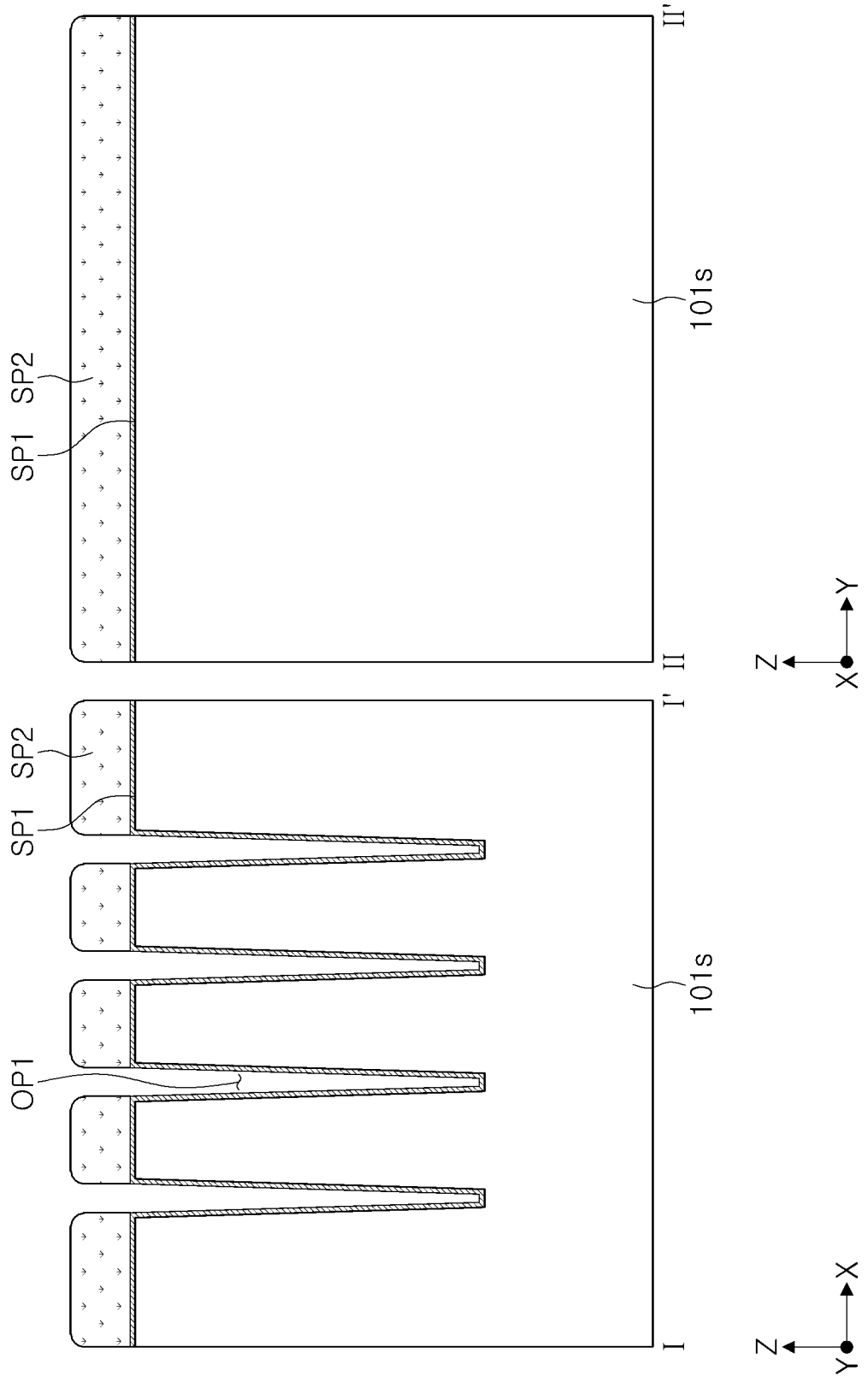

Referring to FIGS. 10A and 10B, a first spacer layer SP1 and a second spacer layer SP2 may be formed in order on the semiconductor substrate 101s including the first openings OP1. The first spacer layer SP1 may be formed on the upper surface of the semiconductor substrate 101s and the openings OP1. The first spacer layer SP1 may be formed of a material able to well fill the inside of the first openings OP1 having a small width. For example, the first spacer layer SP1 may include silicon nitride. The second spacer layer SP2 may be formed on the first spacer layer SP1. The second spacer layer SP2 may be formed on an uppermost surface of the semiconductor substrate 101s other than the first openings OP1. The second spacer layer SP2 may include a material different from that of the first spacer layer SP1. The second spacer layer SP2 may include, for example, polycrystalline silicon. The second spacer layer SP2 may be formed to prevent the first spacer layer SP1 disposed on the uppermost surface of the semiconductor substrate 101s and the region other than the opening OP1 of the semiconductor substrate 101s from being removed together in a process of etching back the first spacer layer SP1 described with reference to FIGS. 11A and 11B.

Figure 11A:
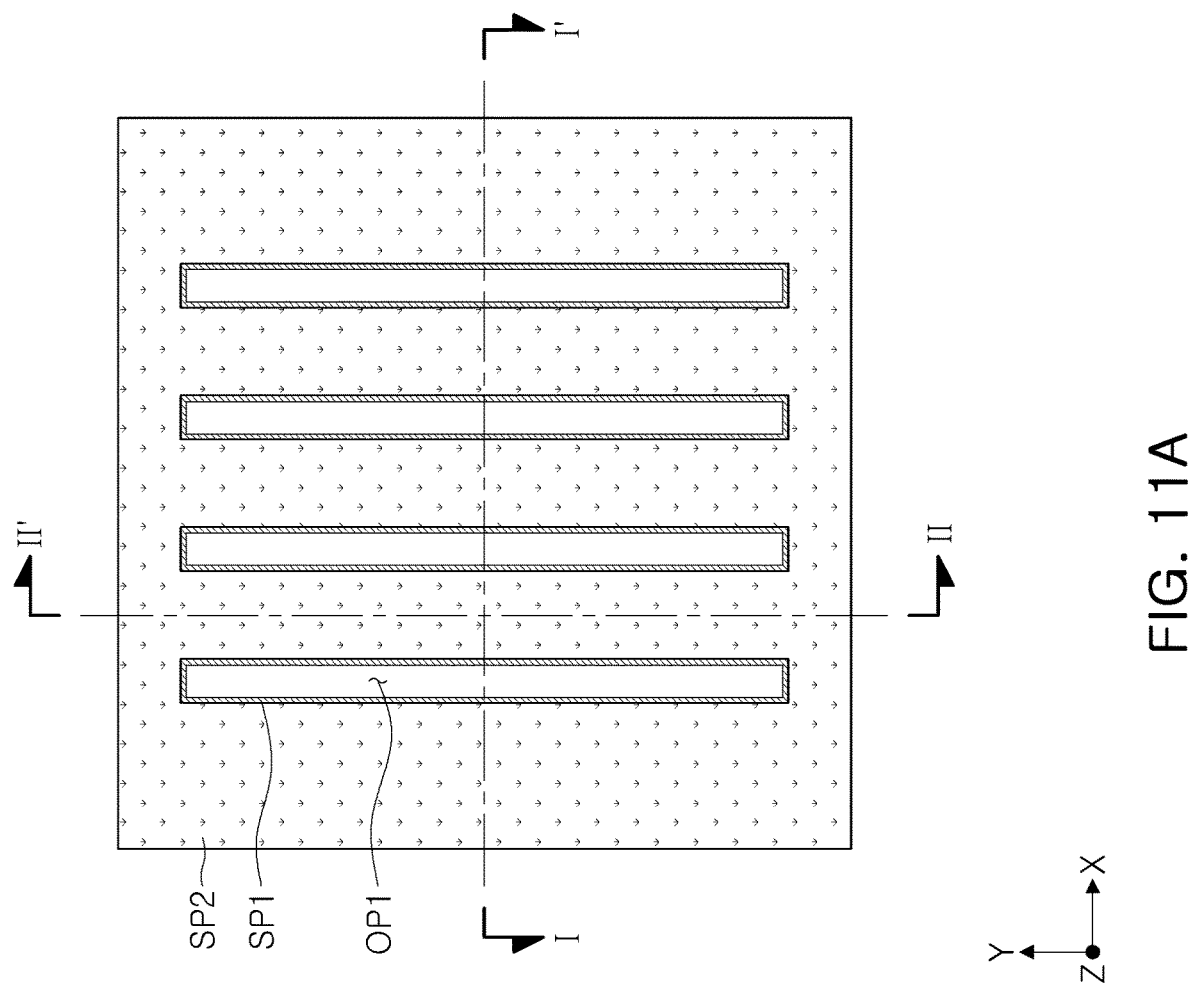
Figure 11B:
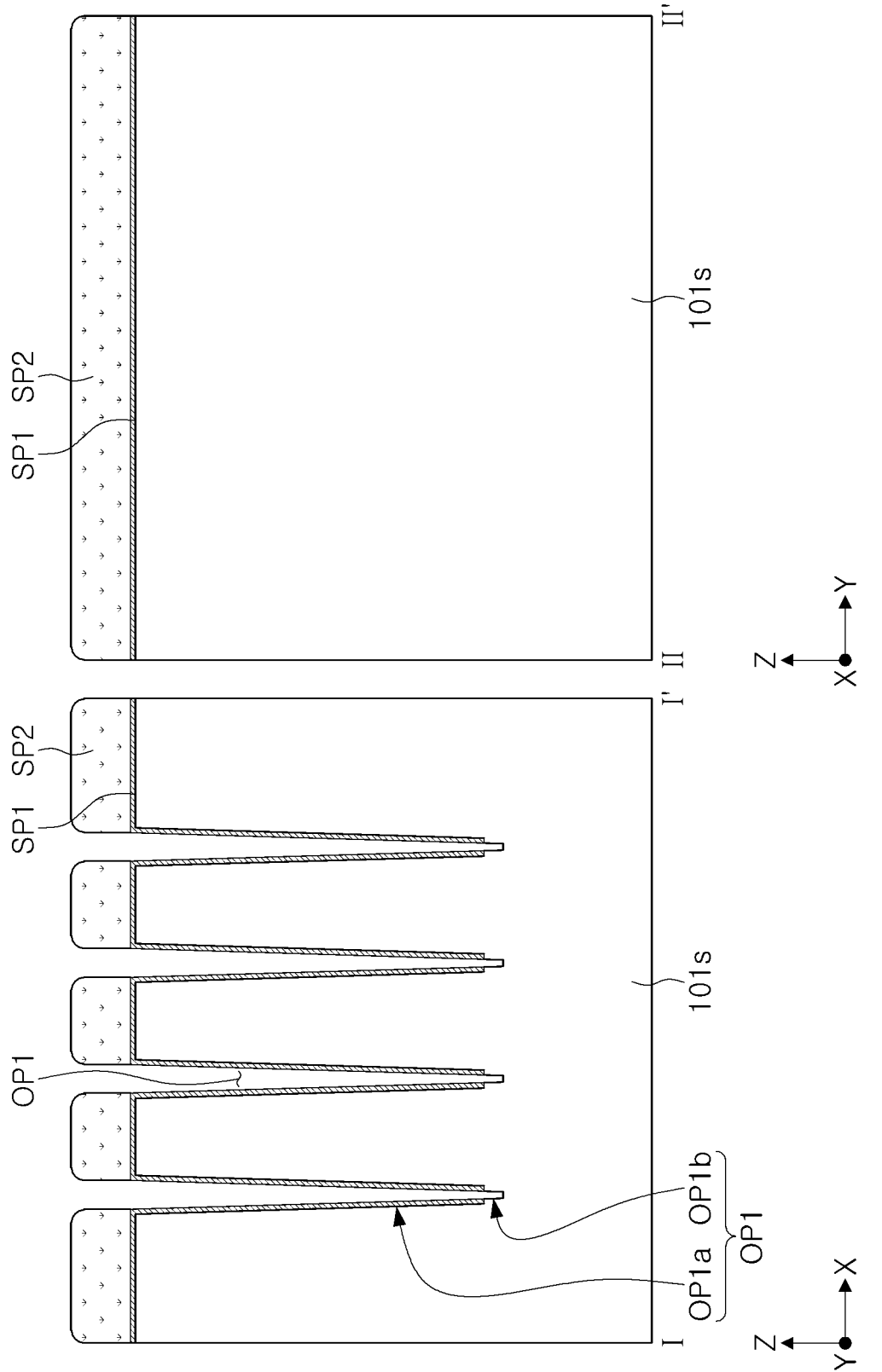

Referring to FIGS. 11A and 11B, a portion of the first spacer layer SP1 disposed on the first openings OP1 may be removed by an etch-back process. A portion disposed on the lower surface of the first opening OP1 of the first spacer layer SP1 may be removed by the etch-back process. A portion of the first spacer layer SP1 may be removed such that a portion of the semiconductor substrate 101s may be exposed. The first openings OP1 may include the first portion OP1a in which the first spacer layer SP1 is disposed on the sidewall thereof and the second portion OP1b in which the semiconductor substrate 101s is exposed since the first spacer layer SP1 is not disposed on the sidewall and the lower surface of the first opening OP1.

Figure 12B:
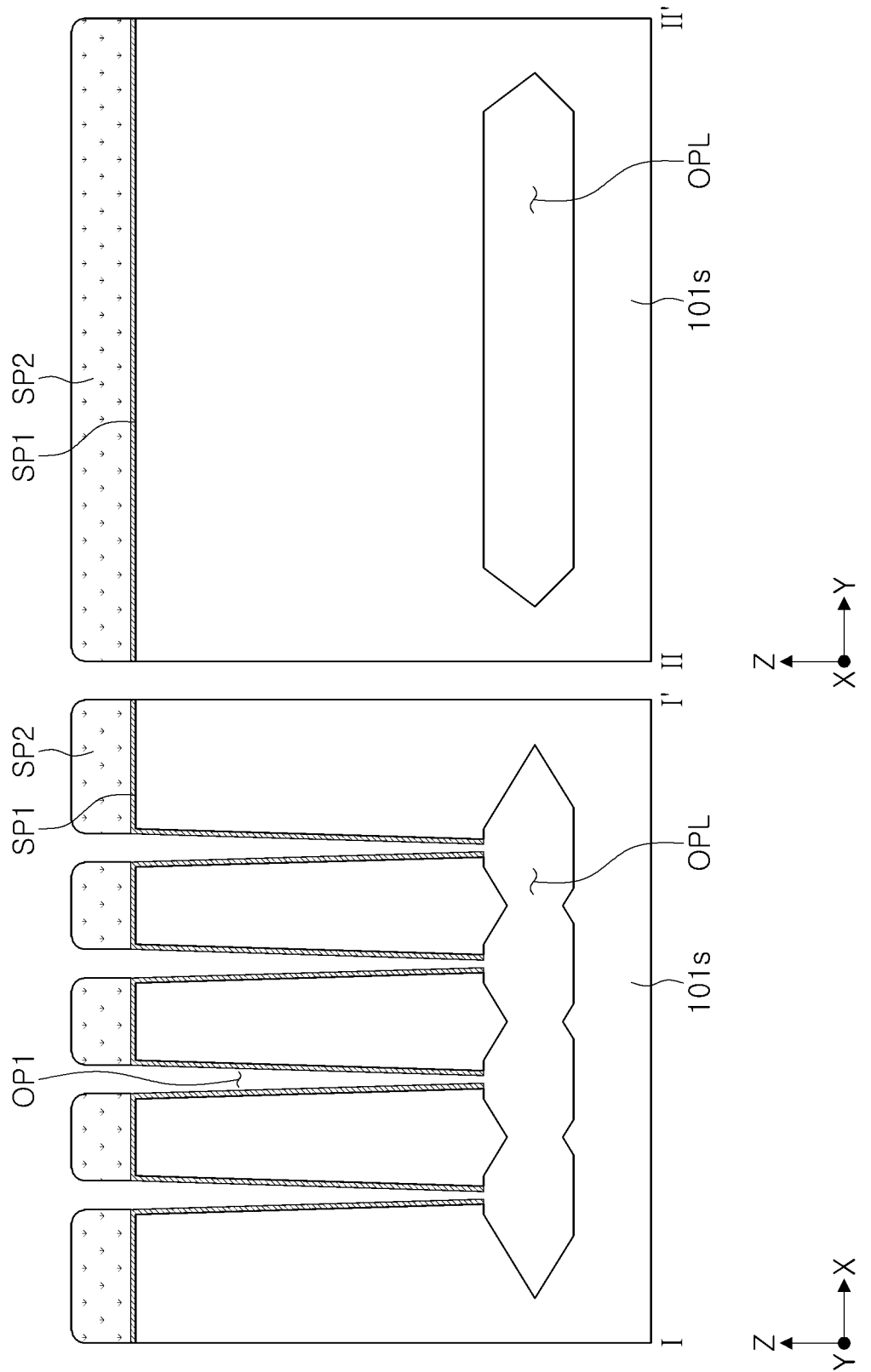

Referring to FIGS. 12A and 12B, a lower opening OPL extending from the first openings OP1 may be formed. The lower opening OPL may be formed by removing a portion of the semiconductor substrate 101s exposed by the second portion OP1b of each of the first openings OP1. The regions from which the semiconductor substrate 101s is removed by each of the first openings OP1 may be connected to each other and may form a single lower opening OPL. The width W3 of the lower opening OPL in the x direction may be greater than a distance d3 between the first openings OP1 that are farthest apart.

The lower opening OPL may be formed by an etching process. The etching process may be, for example, a wet etching process or an isotropic etching process. In an example embodiment, when the lower opening OPL is formed by a wet etching process, the lower opening OPL may have an angular-shaped external side wall similarly to the lower insulating layer 111 described with reference to FIGS. 1 and 2. In an example embodiment, when the lower opening OPL is formed by an isotropic etching process, the lower opening OPL may have a rounded external side wall similarly to the lower insulating layer 111a described with reference to FIGS. 4 and 5.

Figure 13A:
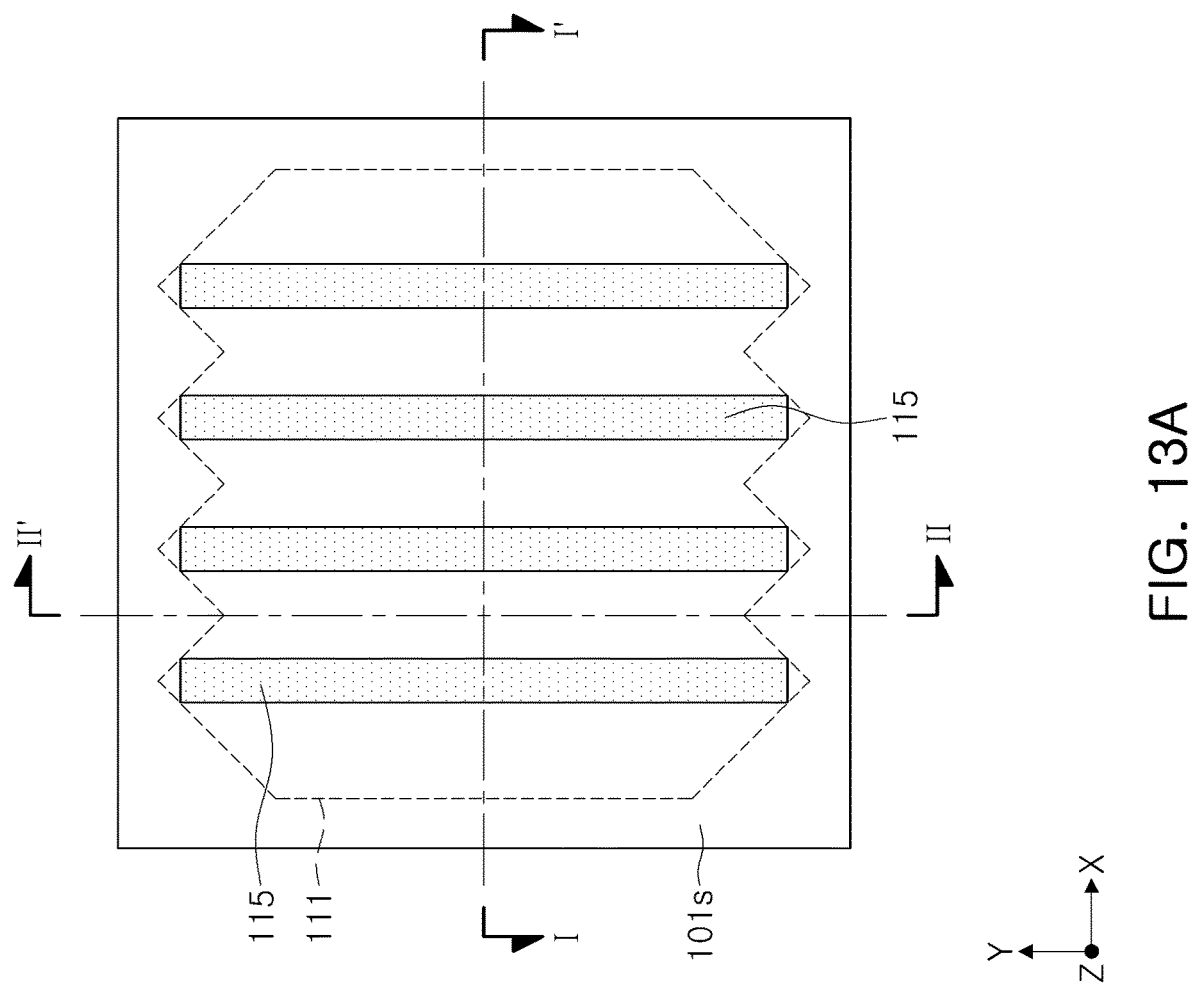
Figure 13B:
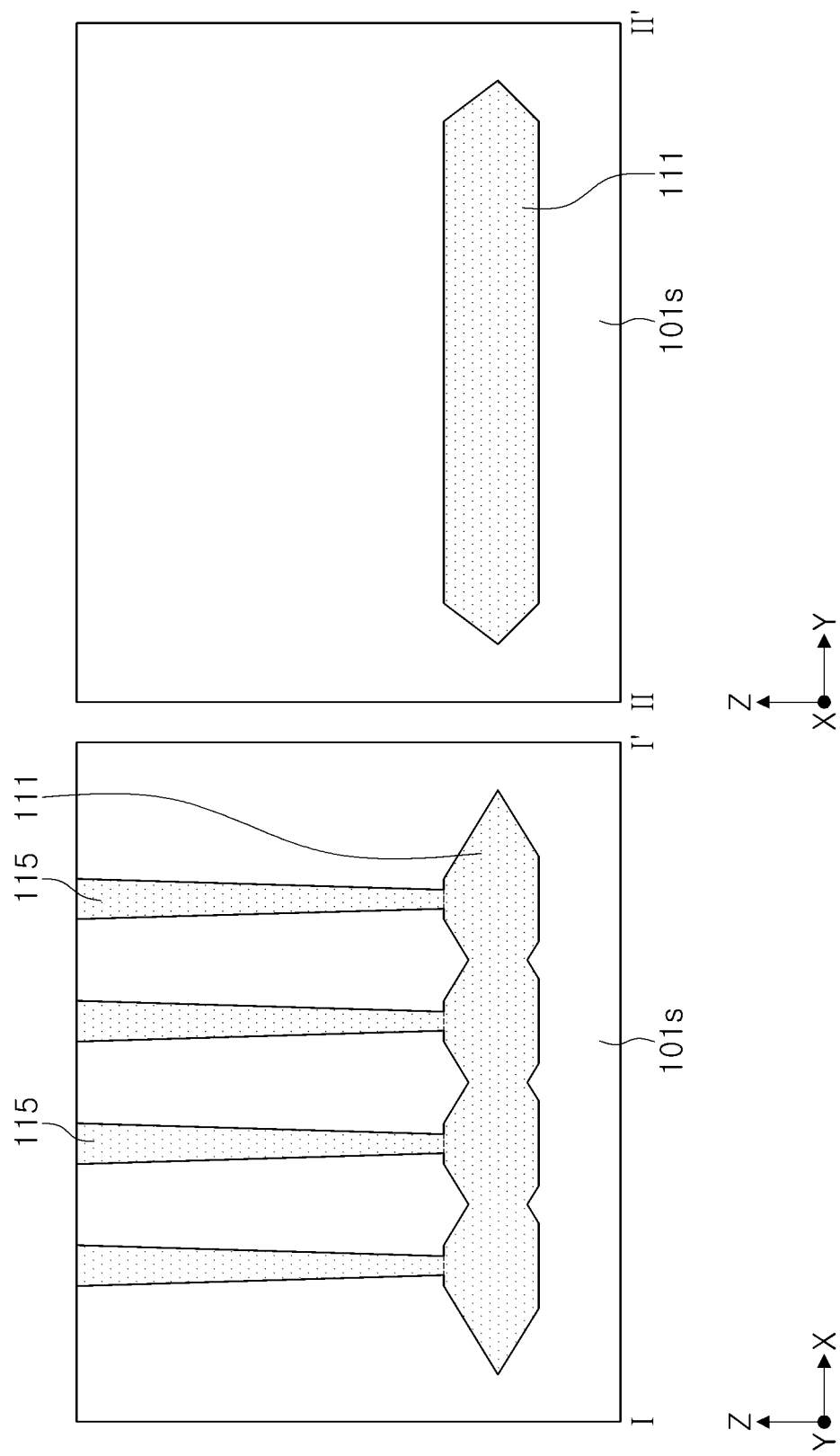

Referring to FIGS. 13A and 13B, the second sidewall insulating layers 115 and the lower insulating layer 111 may be formed by removing the first and second spacer layers SP1 and SP2 and filling an insulating material in the first openings OP1 and the lower opening OPL. The insulating material may be, for example, oxide.

Figure 14B:
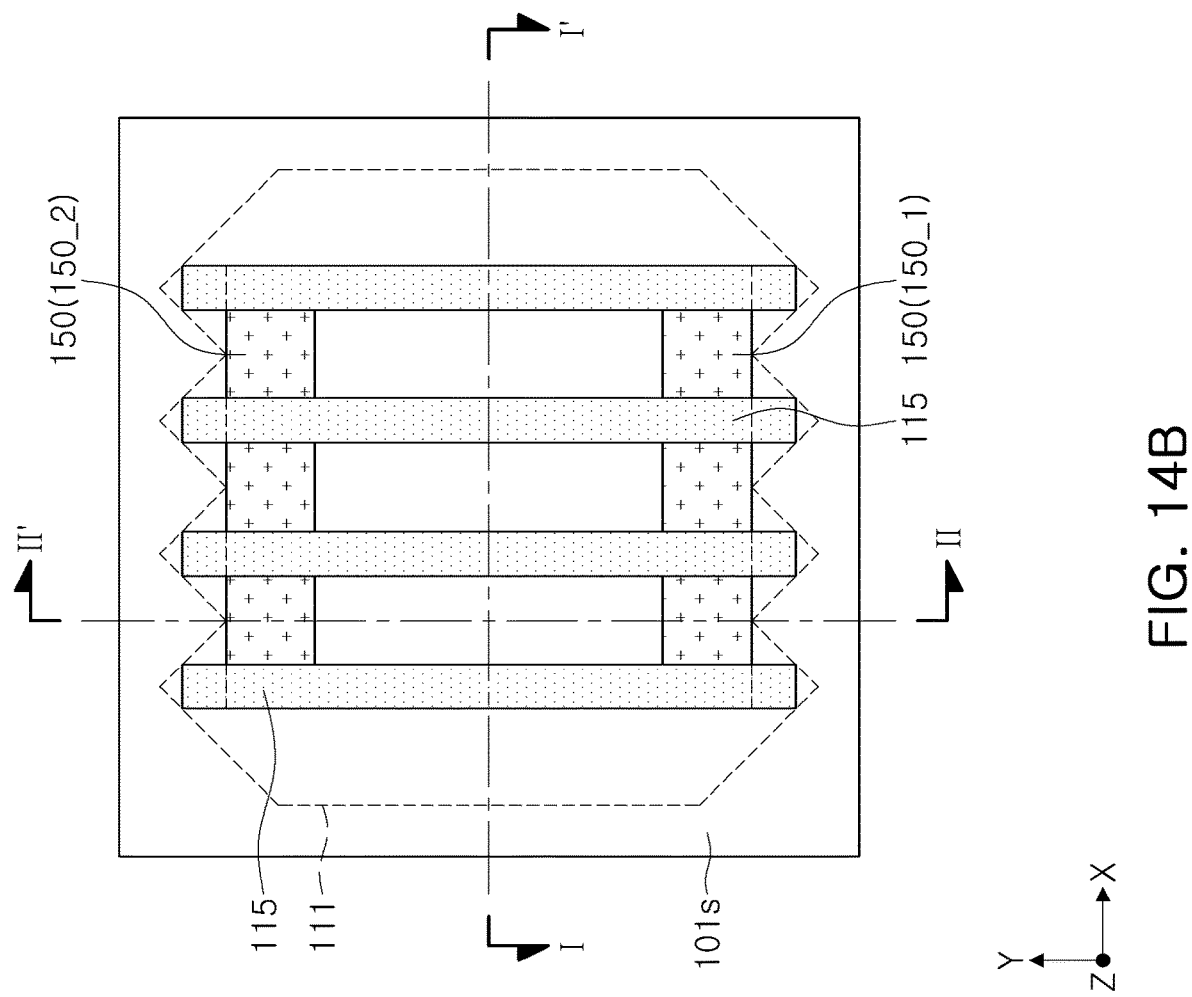
Figure 14B:
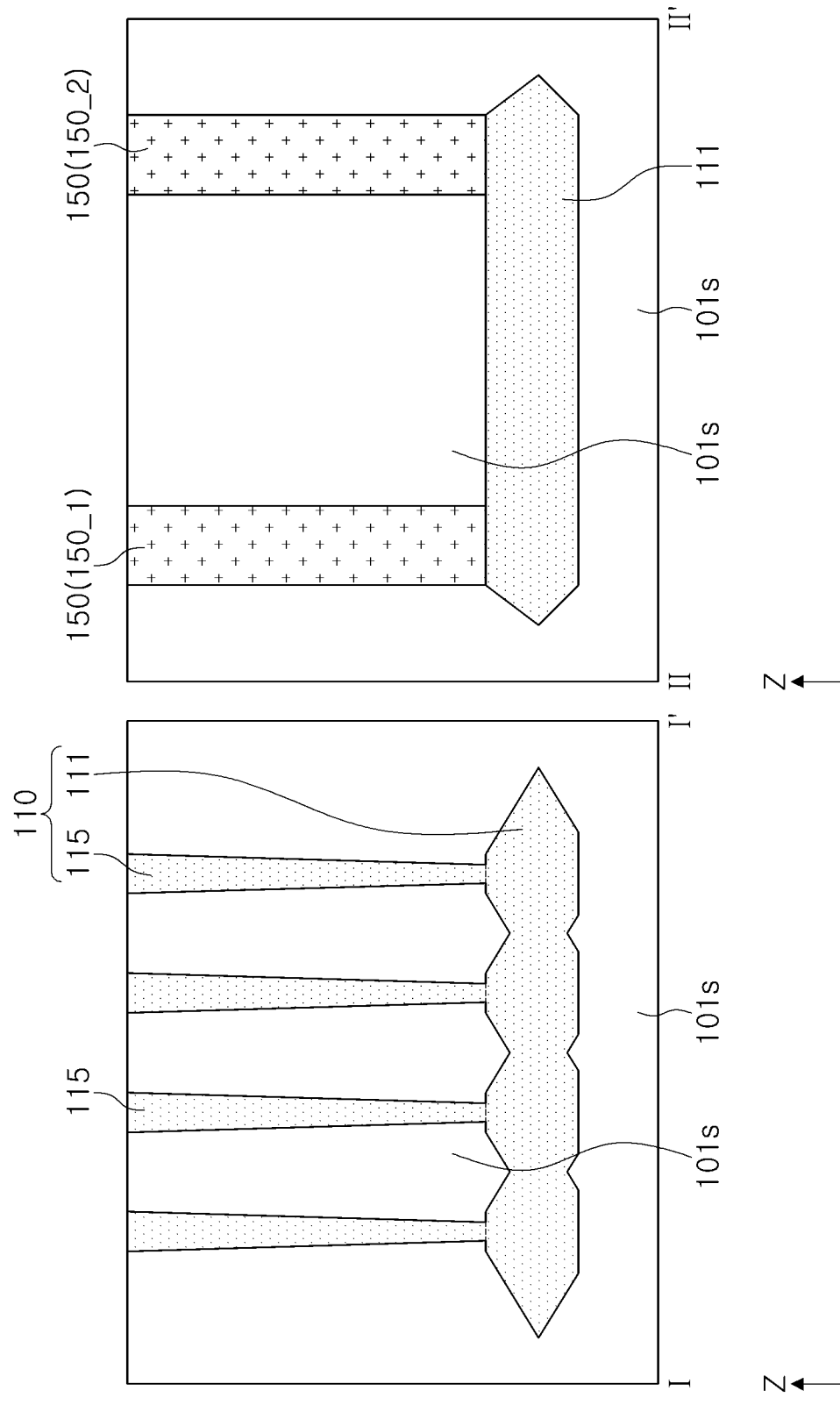

Referring to FIGS. 14A and 14B, source/drain regions 150 spaced apart from each other may be formed between adjacent second sidewall insulating layers 115. The source/drain regions 150 may be formed by doping the semiconductor substrate 101s with impurities. The source/drain regions 150 may be formed by, for example, performing an ion implantation process on the semiconductor substrate 101s. In an example embodiment, the source/drain regions 150 may be deeply formed to be in contact with the lower insulating layer 111. In an example embodiment, the ion implantation process may include implanting impurities by a first energy, implanting impurities by a second energy less than the first energy, and implementing impurities by a third energy less than the second energy. In an example embodiment, processes of implanting the impurities and annealing may be further included.

Figure 15B:
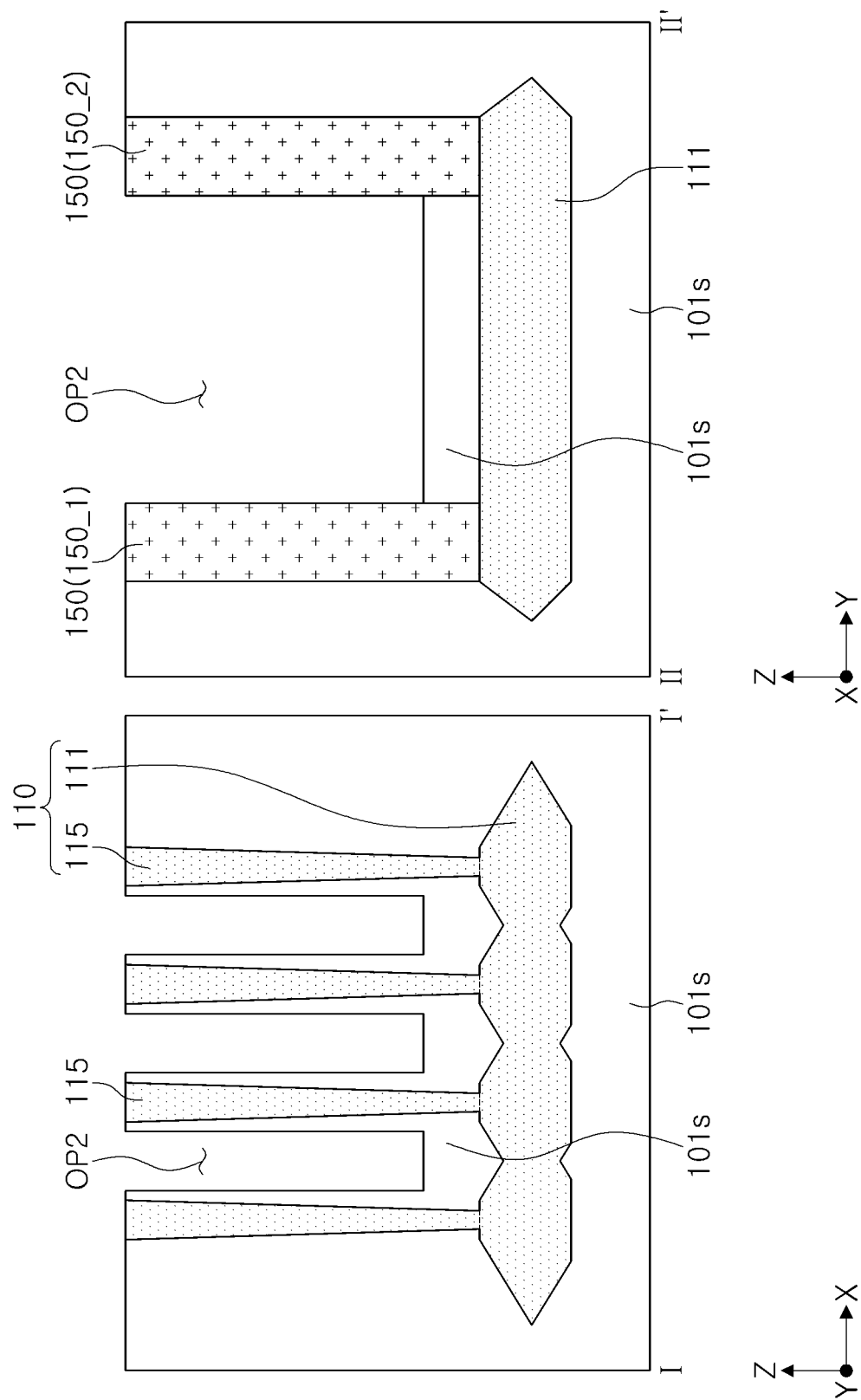

Referring to FIGS. 15A and 15B, a second opening OP2 disposed between adjacent second sidewall insulating layers 115 may be formed. The second opening OP2 may be formed in a position corresponding to the gate structure 160 described with reference to FIGS. 1 and 2. The second opening OP2 may be formed to not expose the lower insulating layer 111. The second opening OP2 may be formed to not expose the second sidewall insulating layers 115. The second opening OP2 may be formed by performing, for example, a photo process and an etching process. A lower surface and a side surface of the second opening OP2 may be surrounded by the lower insulating layer 111 and the adjacent second sidewall insulating layers 115. The second opening OP2 may expose a partial region of the semiconductor substrate 101s and may not expose the lower insulating layer 111 and the second sidewall insulating layers 115.

Figure 16A:
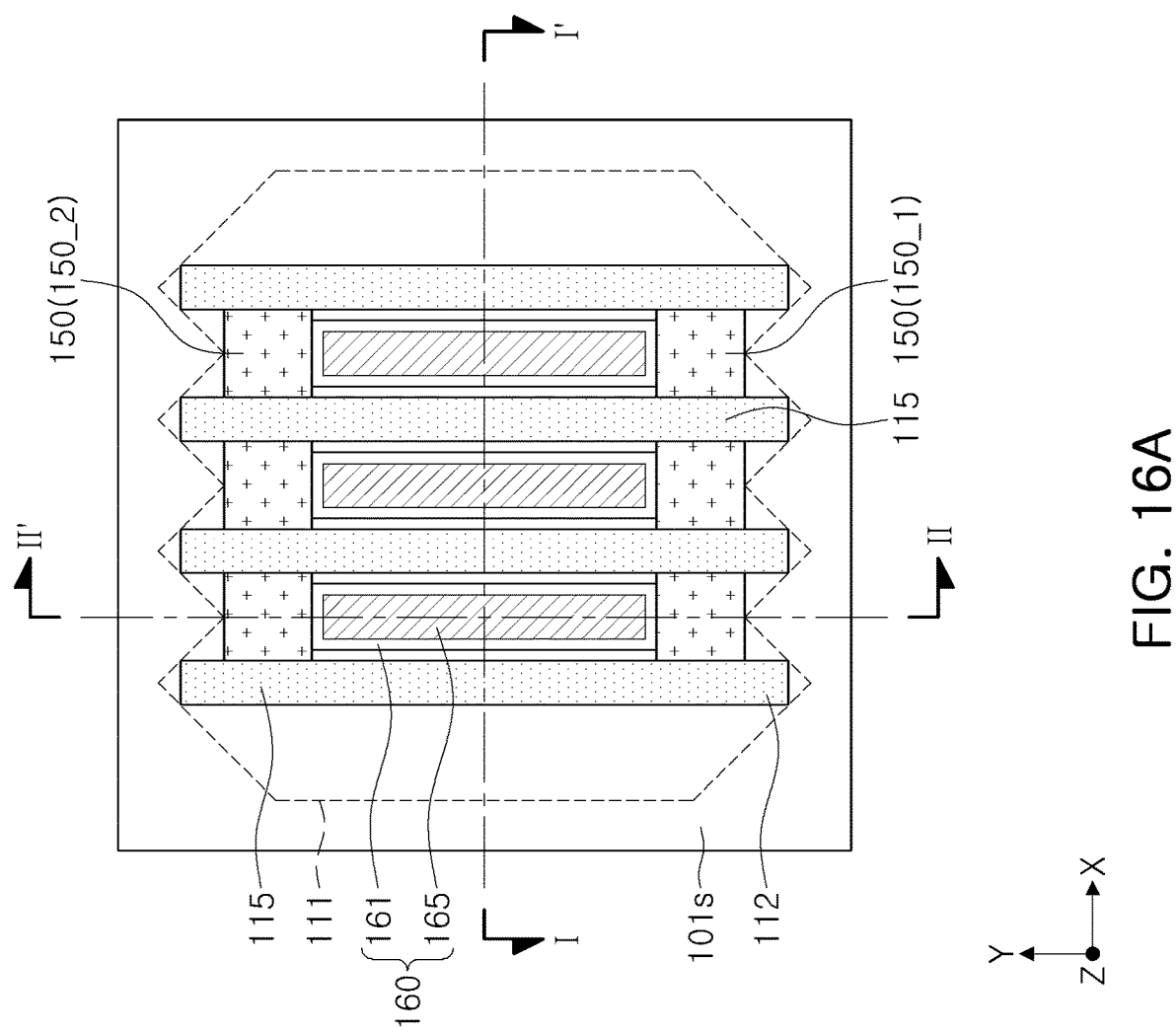
Figure 16B:
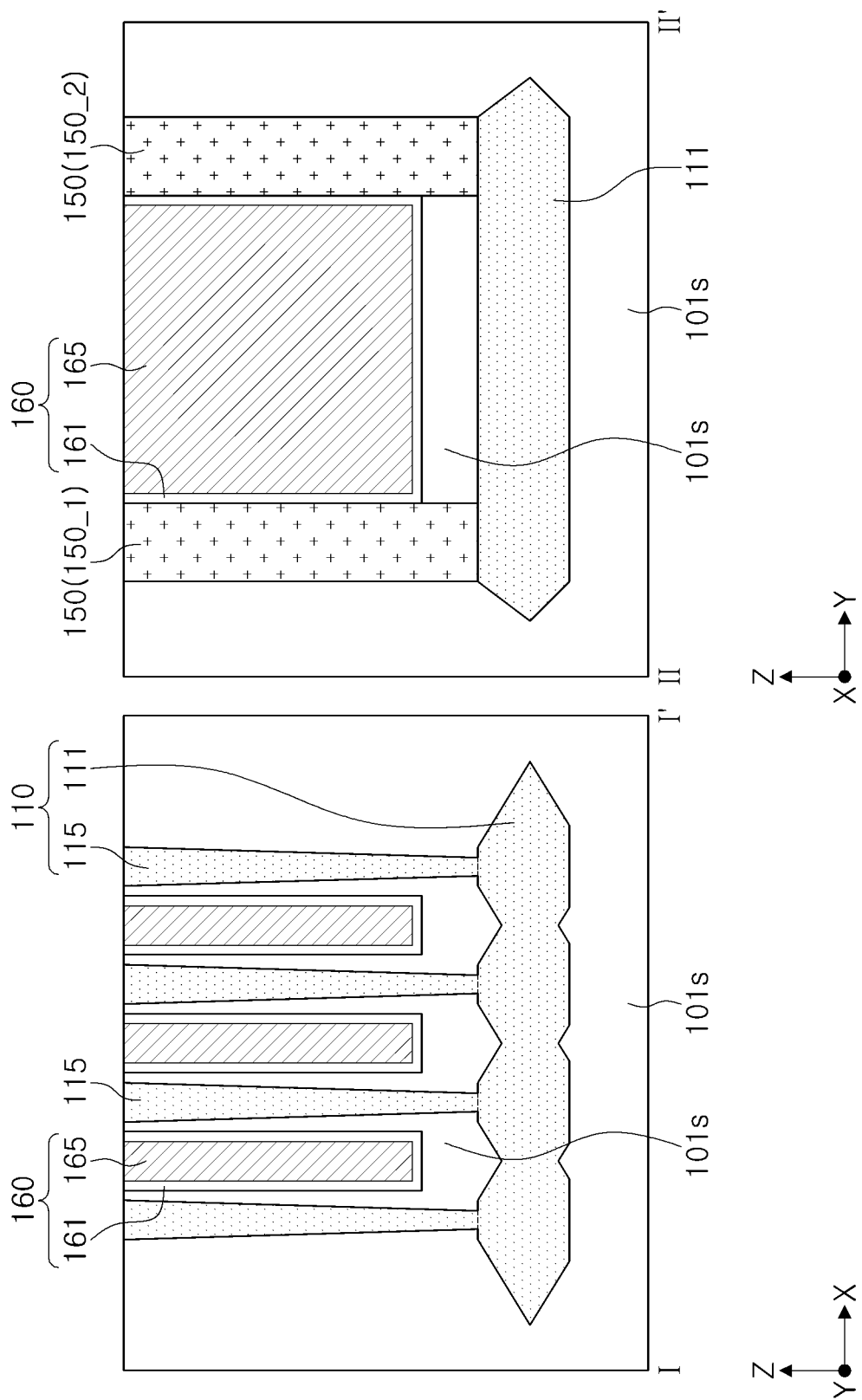

Referring to FIGS. 16A and 16B, a gate dielectric layer 161 including an insulating material may be formed in the second opening OP2, and a gate electrode 165 including a conductive material may be formed on the gate dielectric layer 161, thereby forming the gate structure 160. In an example embodiment, the gate structure 160 may further forma gate capping layer 166 (see FIG. 3) on the gate dielectric layer 161 and the gate electrode 165 by removing the gate electrode 165 and an upper portion of the gate dielectric layer 161.

Figure 17A:
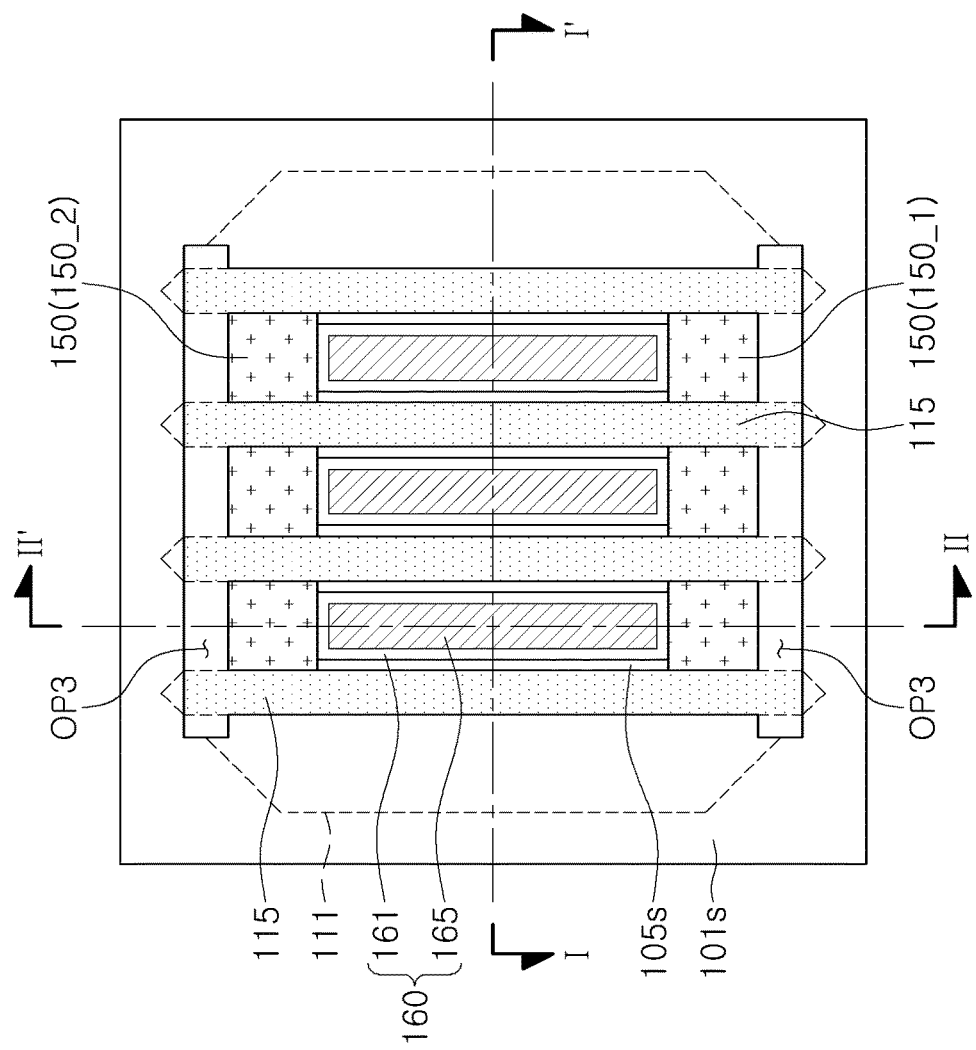
Figure 17B:
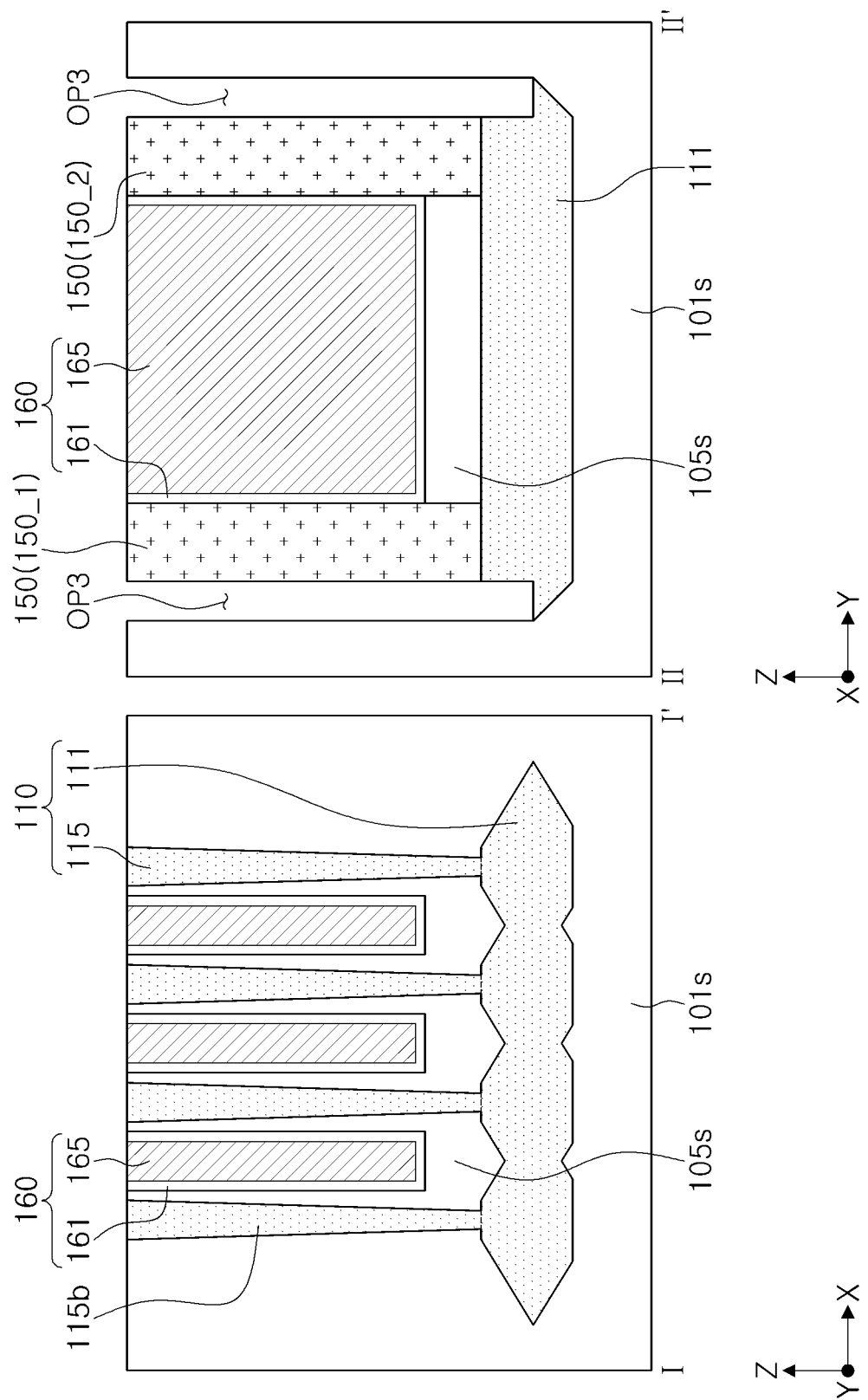

Referring to FIGS. 17A and 17B, third openings OP3 extending in the x direction may be formed such that a portion of each of the second sidewall insulating layers 115 and a portion of the semiconductor substrate 101s are removed. The third openings OP3 may expose a portion of the lower insulating layer 111. A semiconductor layer 105s spaced apart from the semiconductor substrate 101s may be formed by the third openings OP3, the second sidewall insulating layers 115, and the lower insulating layer 111. Side and lower surfaces of the semiconductor layer 105s may be surrounded by the third openings OP3, the second sidewall insulating layers 115, and the lower insulating layer 111. The semiconductor layer 105s may be in contact with the gate structure 160. The semiconductor substrate 101s may be spaced apart from the gate structure 160.

Thereafter, referring to FIGS. 1 and 2 together, the first sidewall insulating layers 112 may be formed by filling inside of the third openings OP3 with an insulating material, thereby forming a substrate insulating structure 110 including the first sidewall insulating layers 112, the second sidewall insulating layers 115 and the lower insulating layer 111. The semiconductor layer 105s may be the active region 105 described with reference to FIGS. 1 and 2.

FIGS. 18A to 21B are diagrams illustrating processes sequence in order to explain of a method of manufacturing a semiconductor device in order according to an example embodiment. In particular, FIGS. 18A to 21B illustrate a method of manufacturing the semiconductor device in FIGS. 6 and 7 according to an example embodiment. FIGS. 18A, 19A, 20A, and 21A are plan layout diagrams illustrating a method of manufacturing a semiconductor device according to example embodiments. FIGS. 18B, 19B, 20B, and 21B are cross-sectional diagrams of intermediate structures illustrating a method of manufacturing a semiconductor device according to example embodiments. FIGS. 18B, 19B, 20B, and 21B illustrate cross-sectional surfaces of the examples in FIGS. 18A, 19A, 20A, and 21A, respectively, taken along lines I-I' and II-II'. Before describing the manufacturing method in FIGS. 18A and 18B, the same manufacturing method described with reference to FIGS. 9A to 13B may be applied.

Figure 18A:
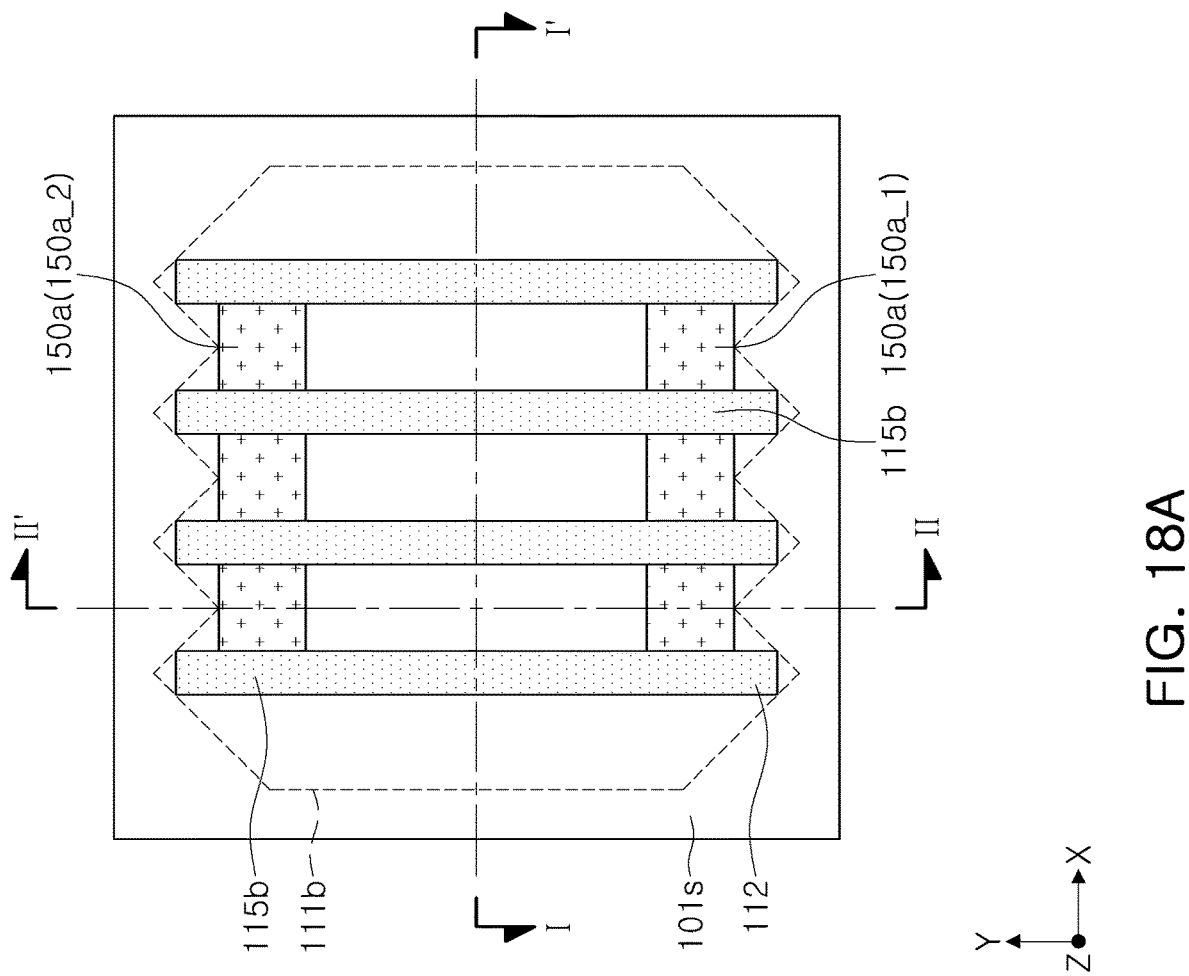
FIGS. 18A to 21B are plan layout views and cross-sectional diagrams of structures that illustrate methods of manufacturing semiconductor devices according to example embodiments of the present disclosure.
Figure 18B:
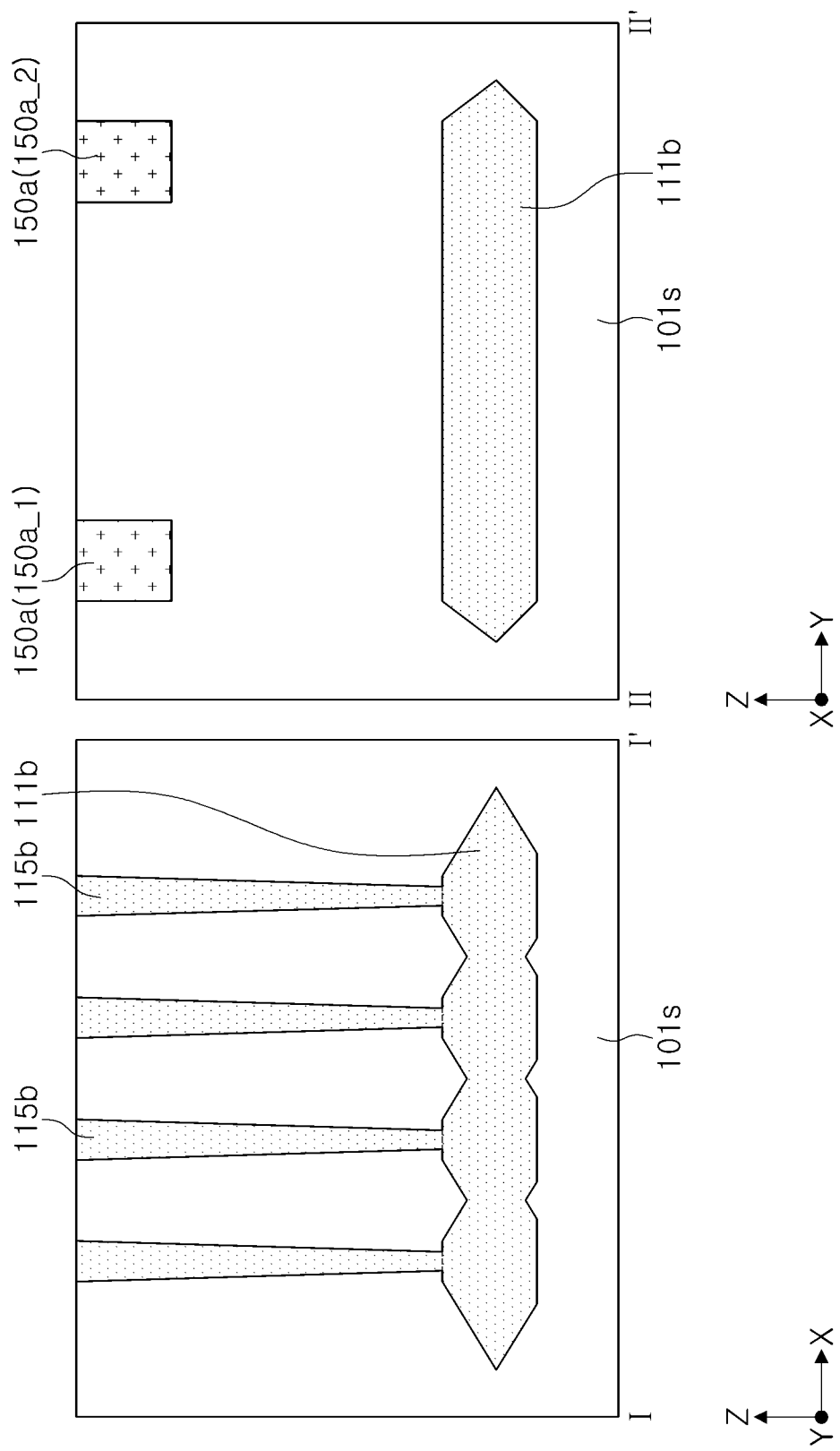

Referring to FIGS. 18A and 18B, source/drain regions 150a spaced apart from each other may be formed between the second sidewall insulating layers 115. The source/drain regions 150a may be formed in an upper region of the semiconductor substrate 101s. The source/drain regions 150a may be formed by doping the semiconductor substrate 101s with impurities. The source/drain regions 150a may be formed by performing, for example, an ion implantation process on the semiconductor substrate 101s. In an example embodiment, the source/drain regions 150 may be spaced apart from the lower insulating layer 111b. In an example embodiment, a depth of the source/drain regions 150a may be smaller than a distance from an uppermost surface of the semiconductor substrate 101s to an upper surface of the lower insulating layer 111b. In an example embodiment, the source/drain regions 150a may include a plurality of layers having different doping concentrations.

Figure 19A:
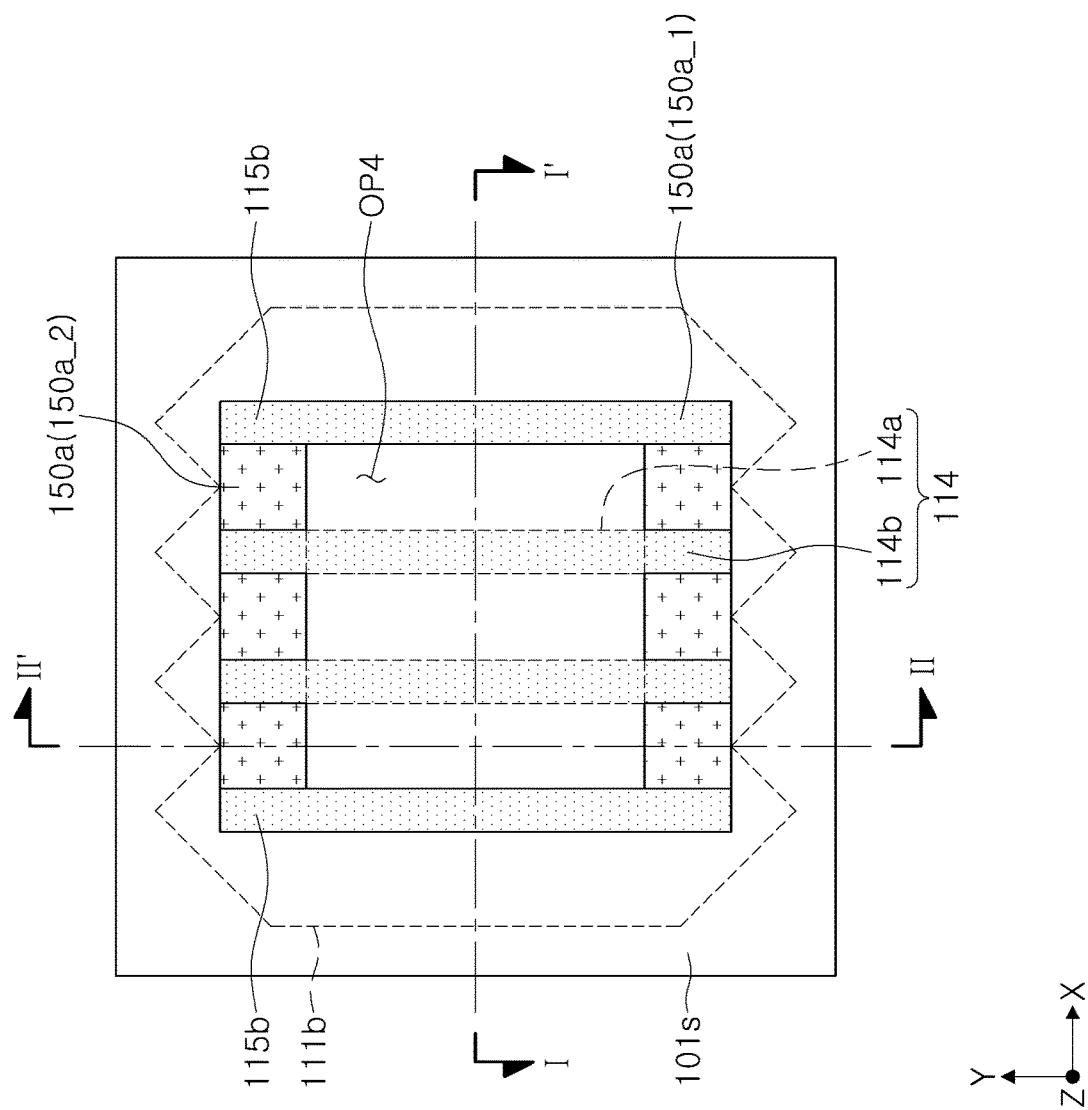
Figure 19B:
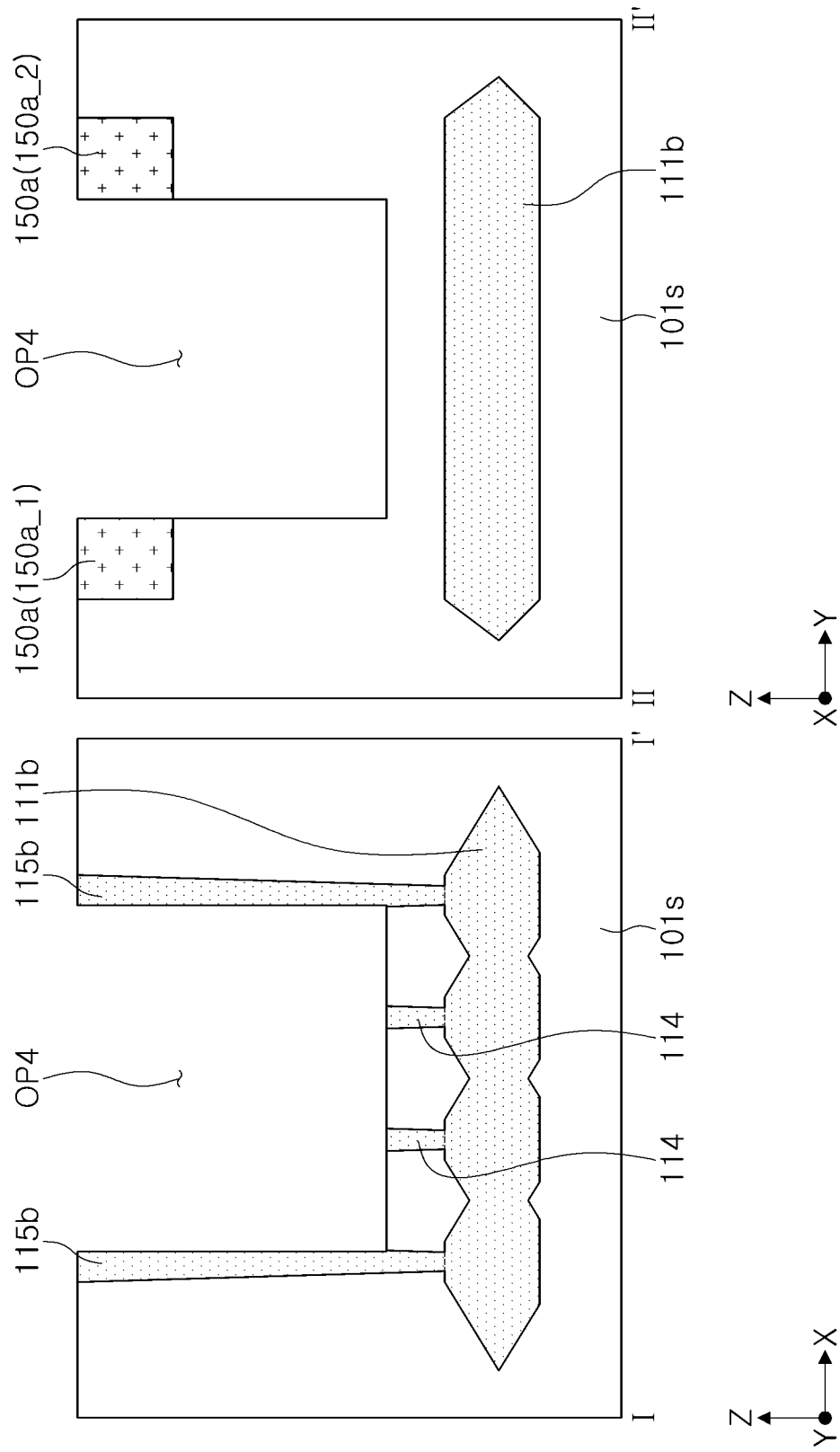

Referring to FIGS. 19A and 19B, a fourth opening OP4 may be formed to remove a portion of the at least one second sidewall insulating layer 115b. The fourth opening OP4 may be formed in a position corresponding to the gate structure 160a described with reference to FIGS. 6 and 7. A portion of the at least one second sidewall insulating layer 115b may be removed such that the third sidewall insulating layer 114 including a portion having a height level lower than a height level of the second sidewall insulating layers 115b may be formed. The fourth opening OP4 may be formed between a pair of the second sidewall insulating layers 115. A third sidewall insulating layer 114 from which a portion of the second sidewall insulating layers 115 is removed may be disposed between a pair of the second sidewall insulating layers 115. The fourth opening OP4 may be disposed between the first and second source/drain regions 150a_1 and 150a_2 spaced apart from each other. The fourth opening OP4 may be formed to not expose the lower insulating layer 111b. The fourth opening OP4 may be formed to expose the second sidewall insulating layers 115. The fourth opening OP4 may be formed by performing, for example, a photo process and an etching process. A lower surface and side surfaces of the fourth opening OP4 may be surrounded by the lower insulating layer 111 and the adjacent second sidewall insulating layers 115. The fourth opening OP4 may expose a partial region of the semiconductor substrate 101s and may expose the second sidewall insulating layers 115 in contact with the semiconductor substrate 101s.

Figure 20A:
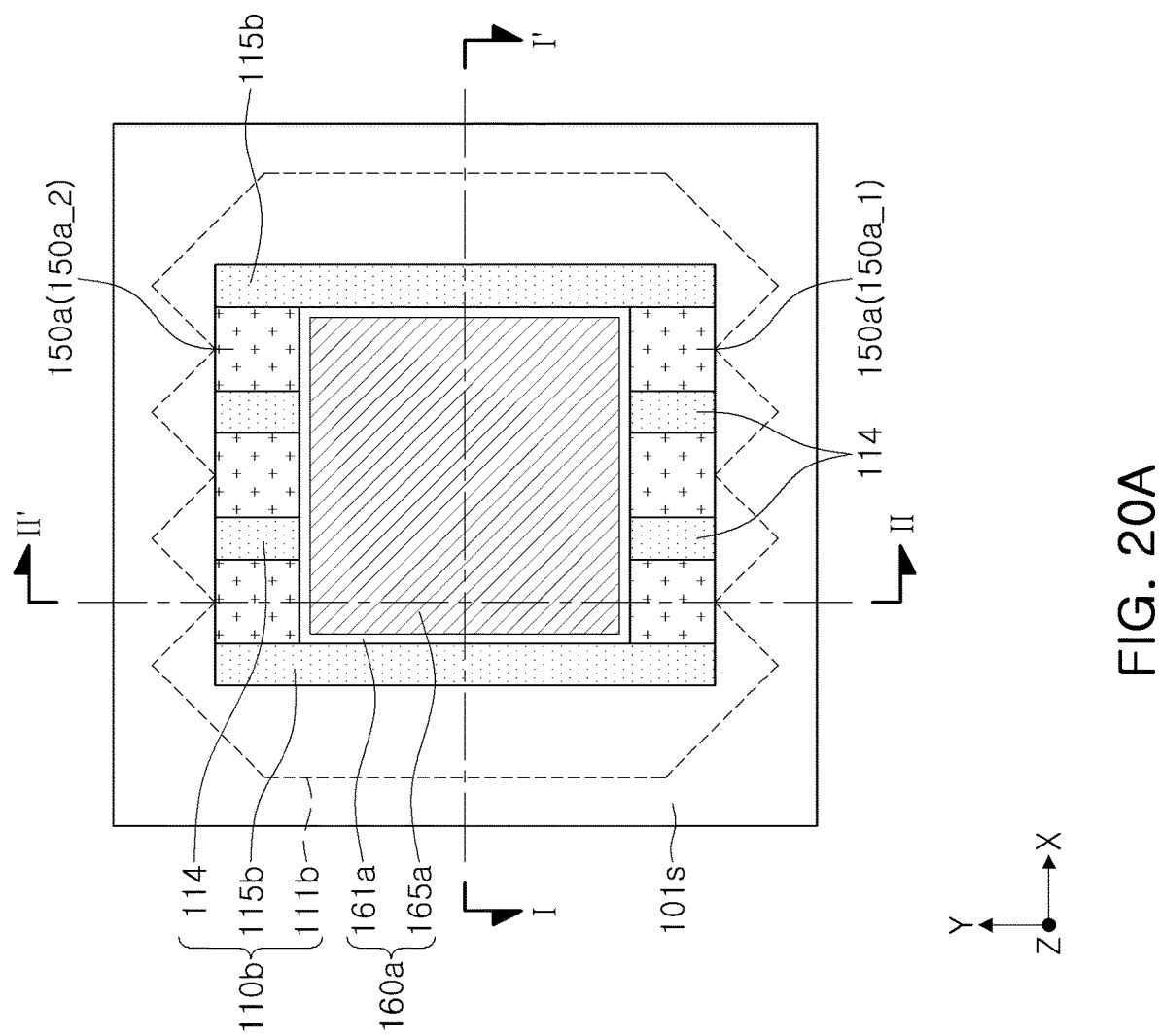
Figure 20B:
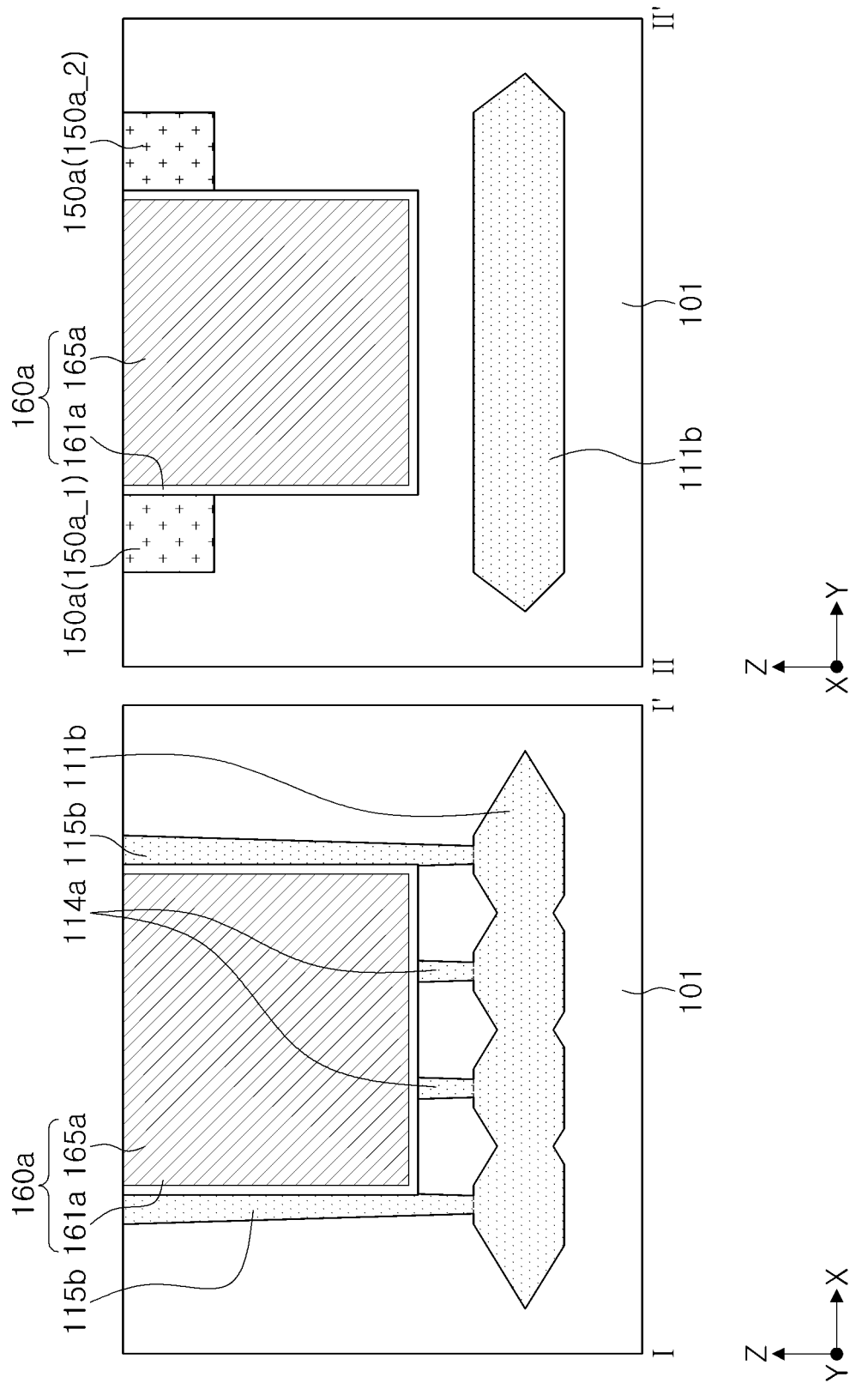

Referring to FIGS. 20A and 20B, a gate dielectric layer 161a including an insulating material may be formed in the fourth opening OP4, and a gate electrode 165a including a conductive material may be formed on the gate dielectric layer 161a, thereby forming the gate structure 160a. In an example embodiment, the gate structure 160a may further form a gate capping layer 166 (see FIG. 3) on the gate dielectric layer 161a and the gate electrode 165a by removing the gate electrode 165a and an upper portion of the gate dielectric layer 161a.

Figure 21A:
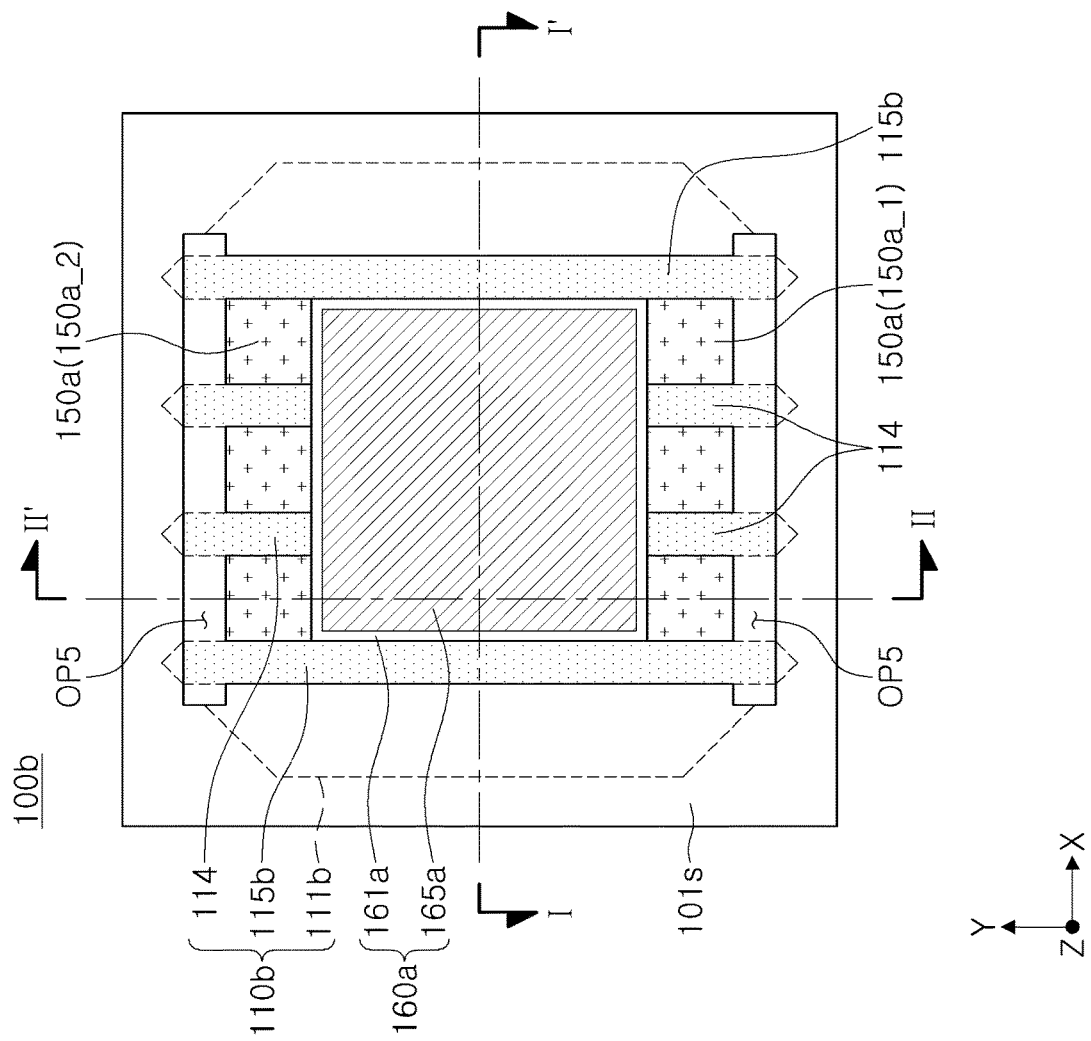
Figure 21B:
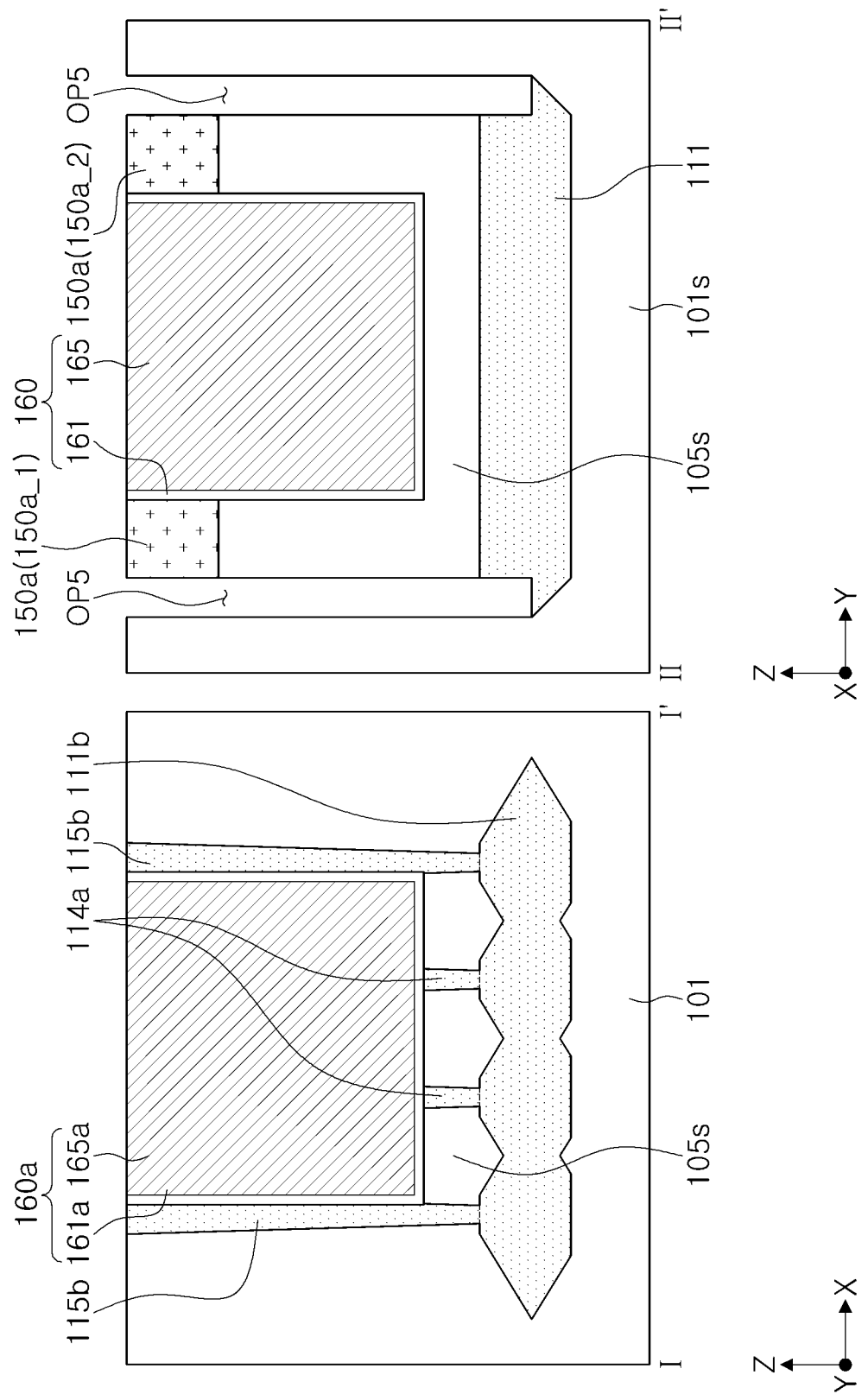

Referring to FIGS. 21A and 21B, fifth openings OP5 extending in the x direction may be formed such that a portion of each of the second sidewall insulating layers 115b and a portion of the semiconductor substrate 101s may be removed. The fifth openings OP5 may expose a portion of the lower insulating layer 111b. A semiconductor layer 105s spaced apart from the semiconductor substrate 101s may be formed by the fifth openings OP5, the second sidewall insulating layers 115b, and the lower insulating layer 111. Side and lower surfaces of the semiconductor layer 105s may be surrounded by the fifth openings OP5, the second sidewall insulating layers 115b, and the lower insulating layer 111b. The semiconductor layer 105s may be in contact with the gate structure 160a. The semiconductor substrate 101s may be spaced apart from the gate structure 160a. A semiconductor layer 150s may be disposed between the fifth openings OP5 and a side surface of the gate structure 160a.

Thereafter, referring to FIGS. 6 and 7 together, the first sidewall insulating layers 112b may be formed by filling inside of the fifth openings OP5 with an insulating material, thereby forming a substrate insulating structure 110b including the first sidewall insulating layers 112b, the second sidewall insulating layers 115b, the third sidewall insulating layer 114 and the lower insulating layer 111b. The semiconductor layer 105s may be the active region 105 described with reference to FIGS. 6 and 7.

According to the aforementioned example embodiments, by including a substrate insulating structure separating the substrate from the active region, a semiconductor device having improved electrical characteristics may be provided.

While the example embodiments have been illustrated and described above, it will be apparent to those skilled in the art that modifications and variations could be made without departing from the scope of the present disclosure as defined by the appended claims.

What is claimed is:
1. A semiconductor device, comprising:
a substrate;
a substrate insulating structure embedded within the substrate, said substrate insulating structure including: (i) first sidewall insulating layers disposed on the substrate, extending along a first direction and spaced apart from each other in a second direction perpendicular to the first direction, (ii) second sidewall insulating layers disposed between the first sidewall insulating layers, in contact with the first sidewall insulating layers and spaced apart from each other in the first direction, and (iii) a lower insulating layer disposed below and in contact with each of the first sidewall insulating layers and the second sidewall insulating layers;

a gate structure having a side surface and a lower surface surrounded by the substrate insulating structure, and including a gate dielectric layer and a gate electrode on the gate dielectric layer;

an active region disposed between the substrate insulating structure and the gate structure; and a first source/drain region and a second source/drain region spaced apart from each other on the active region.

2. The semiconductor device of claim 1, wherein the gate structure is spaced apart from the lower insulating layer and the first sidewall insulating layers; and wherein the substrate at least partially contacts an external side surface and lower surface of the substrate insulating structure.

3. The semiconductor device of claim 1, wherein a side surface of the lower insulating layer protrudes further than a side surface of a second sidewall insulating layer in contact with the substrate among the second sidewall insulating layers in the first direction.

4. The semiconductor device of claim 1,
wherein a width of the lower insulating layer in the first direction is greater than a distance between the first sidewall insulating layers: and
wherein a width of at least a portion of the lower insulating layer in the second direction is greater than a distance between the second sidewall insulating layers.

5. The semiconductor device of claim 1, wherein the active region includes a first portion extending between the lower surface of the gate structure and the lower insulating layer, and a second portion extending between the gate structure and the second sidewall insulating layers.

6. The semiconductor device of claim 1, wherein a side surface of the gate structure is spaced apart from the second sidewall insulating layers.

7. The semiconductor device of claim 1, wherein the first source/drain region is in contact with the lower insulating layer.

8. The semiconductor device of claim 1, wherein three or more of the second sidewall insulating layers are provided; and wherein a plurality of the gate structures are provided, and each of the plurality of gate structures is disposed between adjacent ones of the second sidewall insulating layers.

9. The semiconductor device of claim 1, wherein the active region includes a third portion disposed between the lower surface of the gate structure and the lower insulating layer, and a fourth portion disposed between the gate electrode and the first sidewall insulating layers.

10. The semiconductor device of claim 1, wherein the first and second source/drain regions are spaced apart from the lower insulating layer.

11. The semiconductor device of claim 1, wherein the substrate insulating structure further includes a third sidewall insulating layer disposed between the second sidewall insulating layers; and wherein the third sidewall insulating layer includes at least a portion having a height level lower than a height level of each of the second sidewall insulating layers.

12. The semiconductor device of claim 11, wherein the lower surface of the gate structure is in contact with a portion of the third sidewall insulating layer.

13. The semiconductor device of claim 1, wherein an external side wall of the lower insulating layer has an angular shape.

14. The semiconductor device of claim 1, wherein an external side wall of the lower insulating layer has a rounded shape.

15. A semiconductor device, comprising:
a semiconductor substrate;
an active region spaced apart from the semiconductor substrate by a substrate insulating structure, which is embedded in the semiconductor substrate;
a gate structure on the active region, said gate structure including a gate dielectric layer and a gate electrode on the gate dielectric layer; and
a first source/drain region and a second source/drain region spaced apart from each other within the active region, said first and second source/drain regions having upper surfaces coplanar with an uppermost surface of the substrate; and wherein the substrate at least partially surrounds an external side surface and a lower surface of the substrate insulating structure, wherein the substrate insulating structure surrounds a side surface and a lower surface of the gate structure.

16. The semiconductor device of claim 15, wherein the substrate insulating structure covers the lower surface of the active region.

17. The semiconductor device of claim 15, wherein the semiconductor substrate and the active region include the same semiconductor material; and wherein the semiconductor substrate is spaced apart from the active region.

18. A semiconductor device, comprising:
a substrate;
a substrate insulating structure embedded in the substrate, and including: (i) a lower insulating layer, (ii) first sidewall insulating layers disposed on the lower insulating layer and spaced apart from each other, and (iii) second sidewall insulating layers disposed on the lower insulating layer and in contact with the first sidewall insulating layers, respectively, and extending between the first sidewall insulating layers;
an active region disposed on the lower insulating layer;
a first source/drain region and a second source/drain region spaced apart from each other on the active region; and
a gate structure disposed on the active region, and including a gate dielectric layer and a gate electrode on the gate dielectric layer;
wherein at least a portion of the second sidewall insulating layers, the lower insulating layer, and the first sidewall insulating layers are in contact with the substrate.

* * * * *